United States Patent

Syo

[11] Patent Number: 5,963,732
[45] Date of Patent: Oct. 5, 1999

[54] METHOD FOR SIMULATING IMPURITY DIFFUSION IN SEMICONDUCTOR WITH OXIDATION

[75] Inventor: Toshiyuki Syo, Tokyo, Japan

[73] Assignee: NEC Corporation, Tokyo, Japan

[21] Appl. No.: 08/915,559

[22] Filed: Aug. 21, 1997

[30] Foreign Application Priority Data

Aug. 22, 1996 [JP] Japan .................................... 8-241127

[51] Int. Cl.⁶ ............................ G06F 17/50; G06T 17/20
[52] U.S. Cl. ............................... 395/500.27; 395/500.28; 395/500.33; 395/500.3
[58] Field of Search .............................. 364/578, 468.04; 395/500.28, 500.33, 500.3

[56] References Cited

U.S. PATENT DOCUMENTS 5,675,522  10/1997  Akiyama ................................. 364/578
5,677,846  10/1997  Kumashiro .............................. 345/425

FOREIGN PATENT DOCUMENTS 9-17738  1/1997  Japan .

OTHER PUBLICATIONS

Coughran et al.: Adaptive Grid Generation for VLSI Device Simulation, IEEE Trans. Computer–Aided Design, vol. 10, No. 10, Nov. 1991.

C. S. Rafferty et al., "Iteractive Methods in Semiconductor Device Simulation", IEEE Trans. Electron Devices, vol. ED–32, No. 10, pp. 2018–2027, Oct. 1985.

M. S. Muck, "Tetrahedral Elements and the Sharfetter–Gummel Method", Proceedings of the Nasecode IV, pp. 36–47, 1985.

Primary Examiner—Kevin J. Teska
Assistant Examiner—Hugh Jones
Attorney, Agent, or Firm—Whitham, Curtis & Whitham

[57] ABSTRACT

In a method for simulating a concentration of impurities within a semiconductor device while the semiconductor device is being oxidized, the semiconductor device is divided into a triangular mesh configuration having grids arranged in triangles. One of the triangles is divided into three control volumes, and each of the control volumes includes a circumcenter and one grid of a respective one of the triangles.

3 Claims, 39 Drawing Sheets

PX

PX

PX

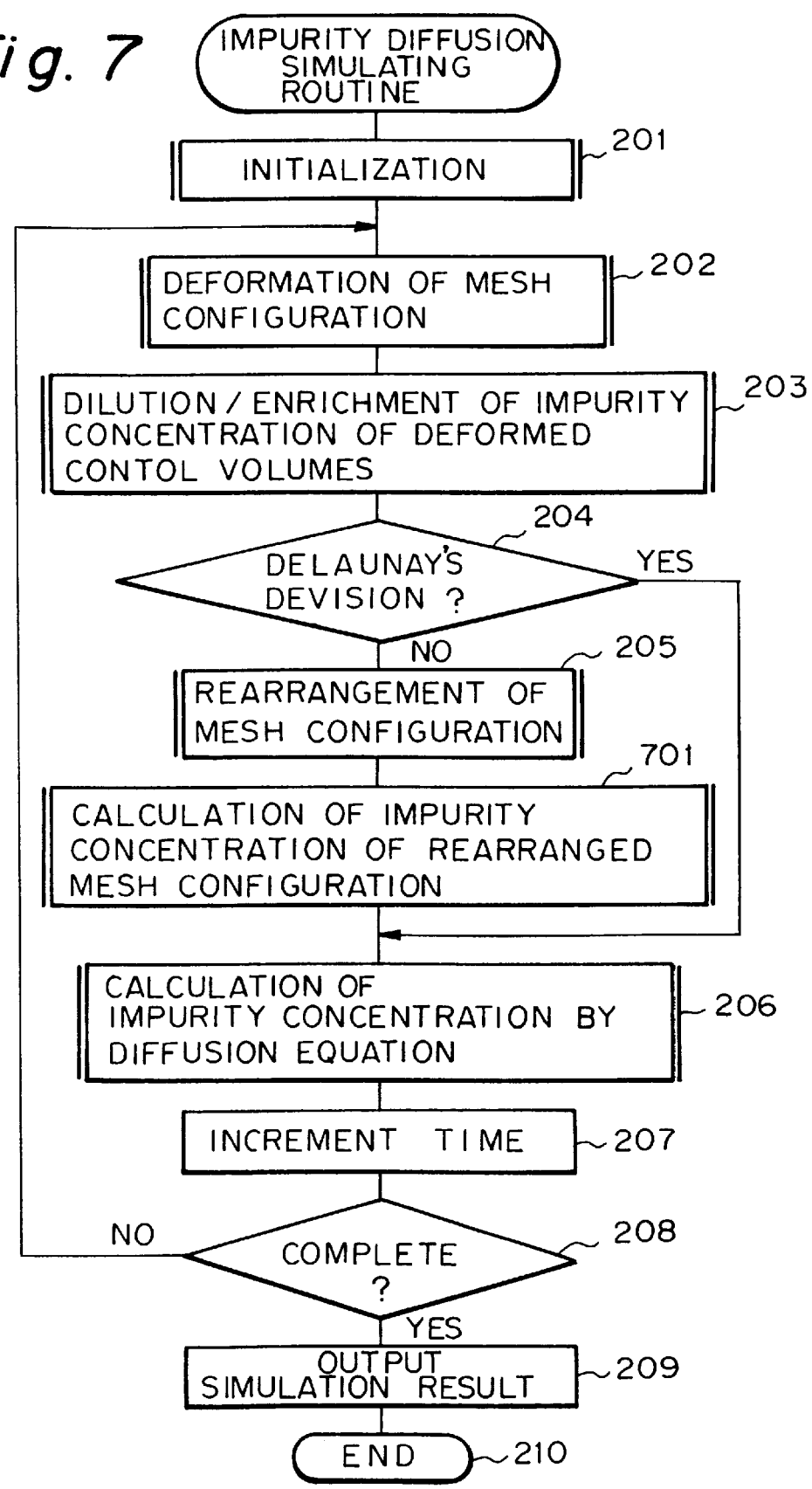

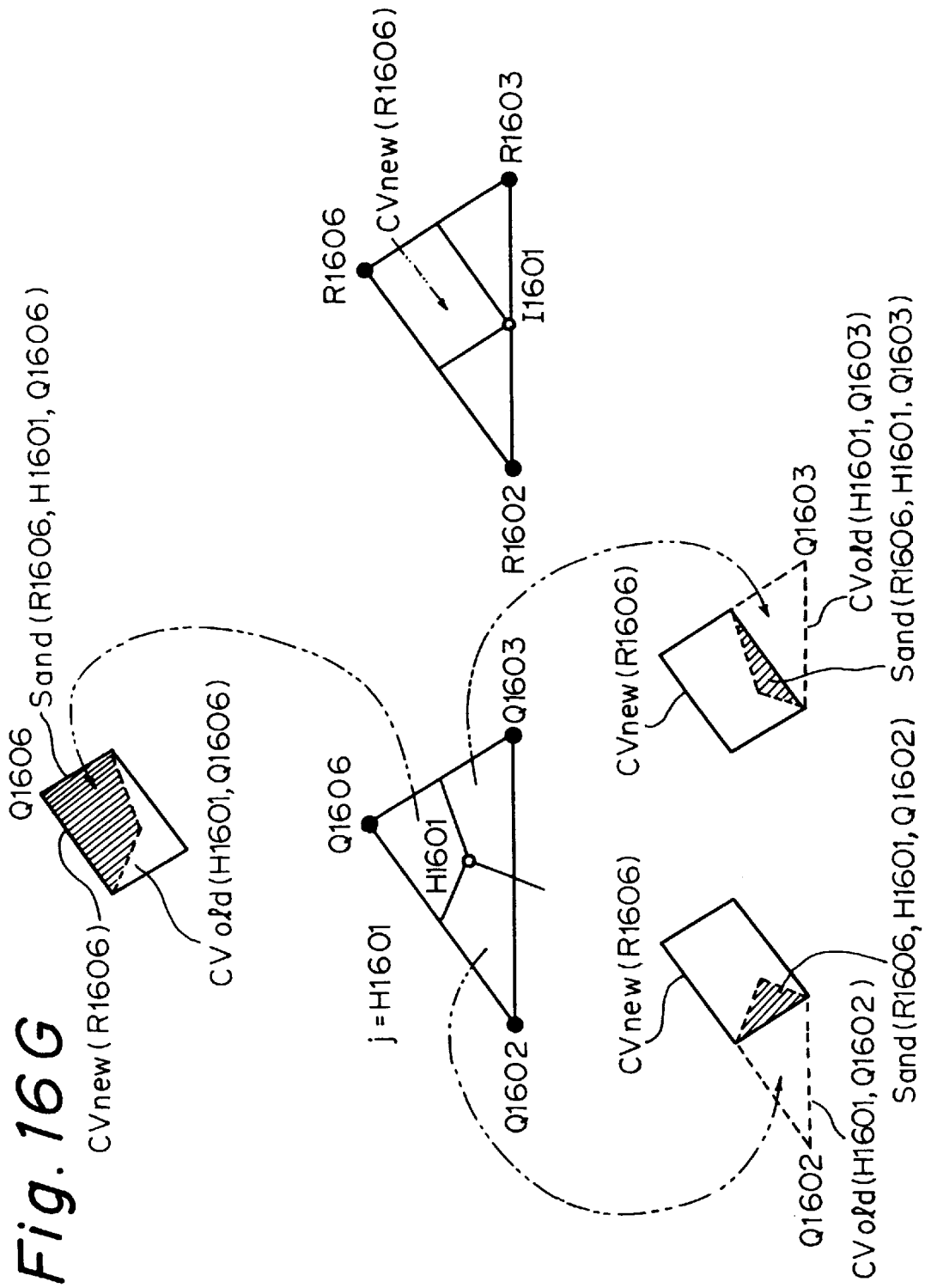

METHOD FOR SIMULATING IMPURITY DIFFUSION IN SEMICONDUCTOR WITH OXIDATION

BACKGROUND OF THE INVENTION

1. Field of the Invention

The present invention relates to a method for simulating an impurity diffusion in a semiconductor while the semiconductor is being oxidized.

2. Description of the Related Art

In a prior art method for simulating a concentration of impurities within a silicon material while the silicon material is being oxidized, an initial triangular mesh configuration is set in a semiconductor device. Particularly, a trench structure can be accurately represented by the triangular mesh configuration (see: C. S. Rafferty et al., "Iteractive Methods in Semiconductor Device Simulation", IEEE Transactions on Electron Devices, Vol. ED-32, No. 10, pp. 2018–2027, October 1985). Also, a control volume is set in each mesh point (grid). In this case, a closed surface of the control volume is defined by circumcenters. One of the circumcenters is a center of a circle that is circumscribed about a triangle formed by three grids. Further, initial impurity concentrations are set for the control volumes.

Next, the semiconductor device, i.e., the triangle mesh configuration is deformed by assuming an execution of an oxidation process thereupon. Concretely, the locations of the grids are changed, and the control volumes thereof are also deformed.

Next, the impurity concentrations of the deformed control volumes are changed. For example, if the deformed control volume is increased, its impurity concentration is diluted. Contrary to this, if the deformed control volume is decreased, its impurity concentration is enriched.

Next, it is determined whether or not the deformed mesh configuration satisfies Delaunay's division, which will be explained later in detail. Only when the deformed mesh configuration does not satisfy Delaunay's division, is a new mesh configuration satisfying Delaunay's division arranged, and also appropriate impurity concentrations are given to new grids.

Next, impurity concentrations for the grids of the deformed or rearranged mesh configuration are calculated by an impurity diffusion equation.

The prior art impurity diffusion simulation method will be explained later in detail.

In the above-mentioned prior art impurity diffusion simulation method, however, after the new mesh configuration is arranged, the control volumes are also changed. Therefore, since the impurity concentrations of the grids are not changed even when the control volumes are changed by the arrangement of the mesh configuration, the total amount of impurities is not preserved between the deformed mesh configuration and the non-deformed mesh configuration. This makes the impurity concentrations inaccurate.

SUMMARY OF THE INVENTION

It is an object of the present invention to provide a method for simulating an impurity diffusion in a semiconductor material while the semiconductor material is being oxidized, in which the total amount of impurities is almost preserved between a deformed mesh configuration and a non-deformed mesh configuration, which can make the impurity concentrations accurate.

According to the present invention, in a method for simulating a concentration of impurities within a semiconductor device while the semiconductor device is being oxidized, the semiconductor device is divided into a triangular mesh configuration having grids arranged in triangles. One of the triangles is divided into three control volumes, and each of the control volumes includes a circumcenter and one grid of a respective one of the triangles.

Thus, if a grid is moved, control volumes belonging to the grid always include the grid.

BRIEF DESCRIPTION OF THE DRAWINGS

The present invention will be more clearly understood from the description as set forth below, in comparison with the prior art, with reference to the accompanying drawings, wherein:

FIG. 7 is a flowchart showing a proposed impurity diffusion simulation method;

FIGS. 16A through 16H are diagrams for explaining the flowcharts of FIGS. 14 and 15;

DESCRIPTION OF THE PREFERRED EMBODIMENTS

Before the description of the preferred embodiment, a prior art impurity diffusion simulation method will be explained with reference to FIGS. 1, 2, 3A, 3B, 4A, 4B, 5, 6A, 6B and 6C.

Figure 1:
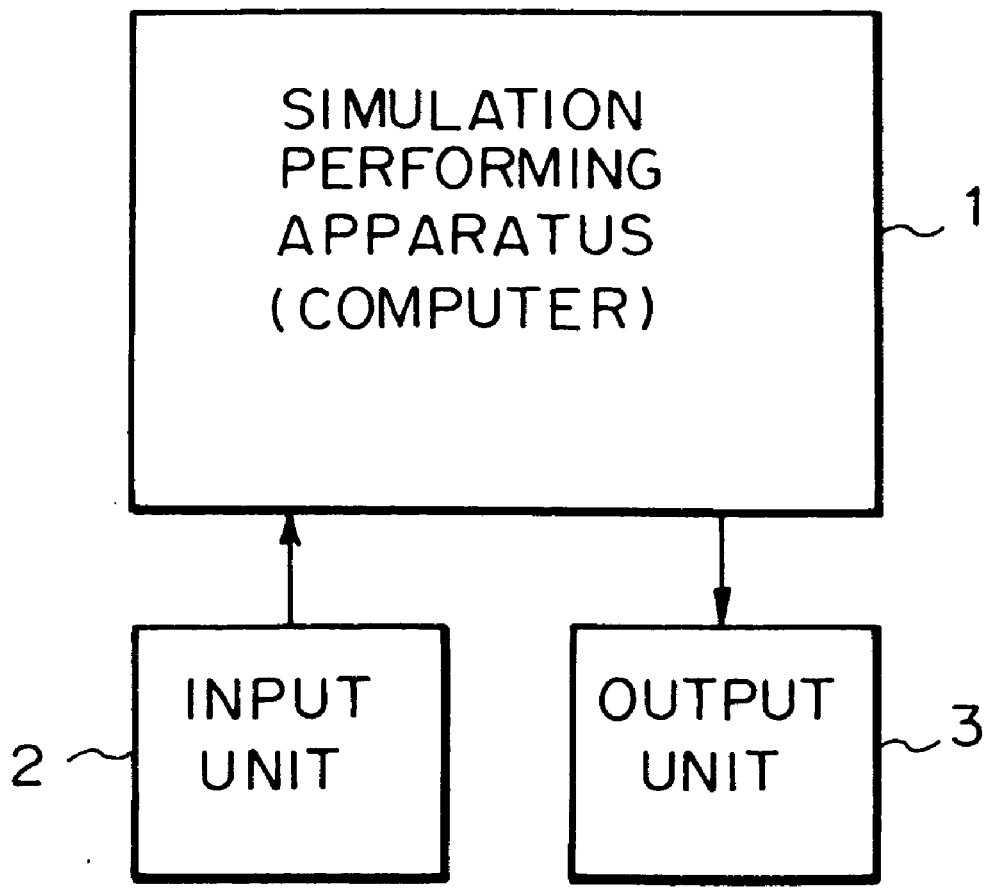
FIG. 1 is a block circuit diagram illustrating a prior art simulation system.

In FIG. 1, which illustrates a prior art simulation system, the simulation system is comprised of a simulation performing apparatus 1 such as a computer, an input unit 2 for inputting simulation initial values, and an output unit 3 for outputting a simulation result, The simulation performing apparatus 1 is formed by a central processing unit (CPU), a read-only memory (ROM), a random access memory (RAM) and the like.

Figure 2:
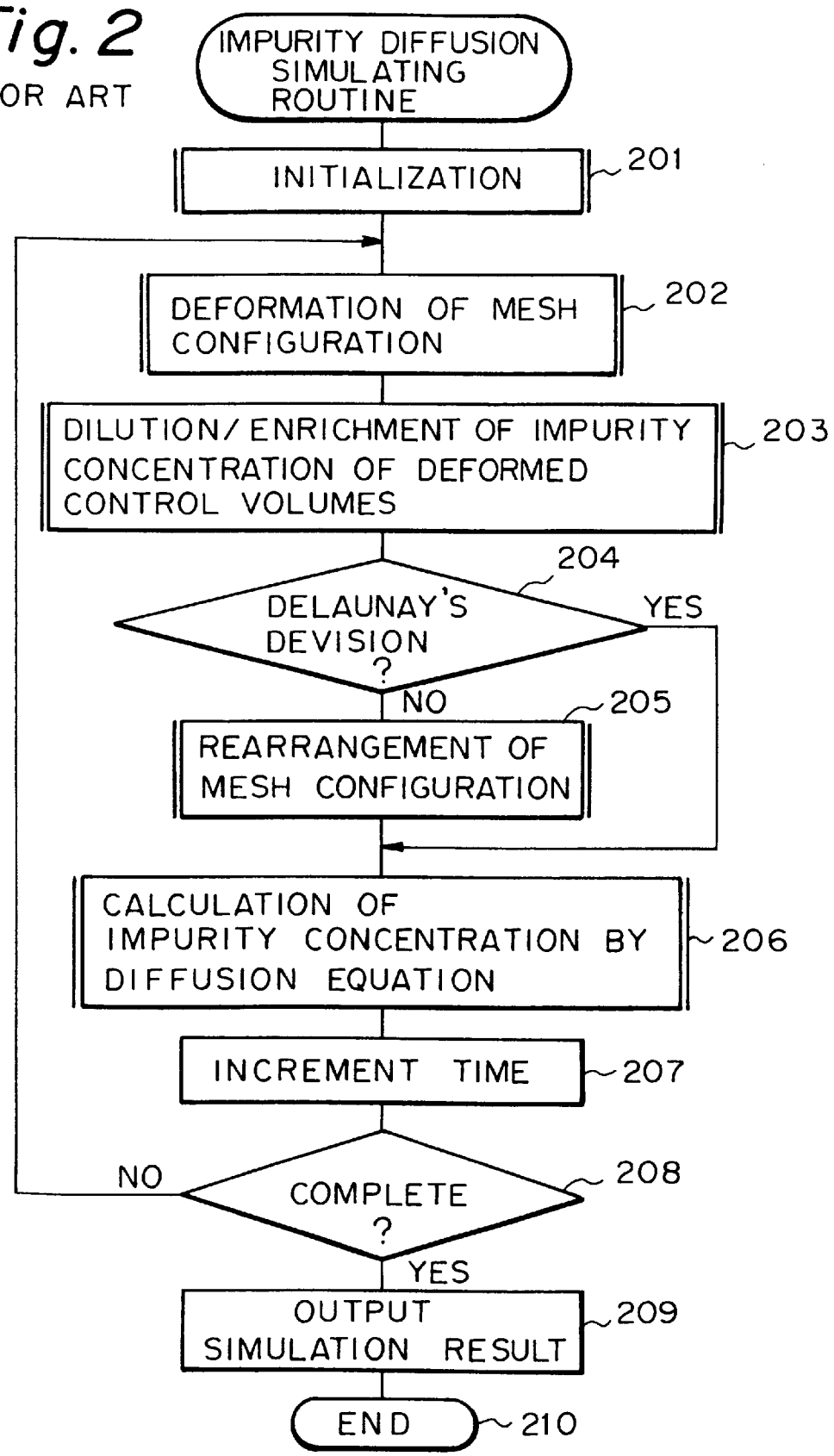
FIG. 2 is a flowchart showing a prior art impurity diffusion simulation method.

FIG. 2 is a flowchart showing a prior art impurity diffusion simulation method which is carried out by the simulation performing apparatus 1 of FIG. 1.

Figure 3A:
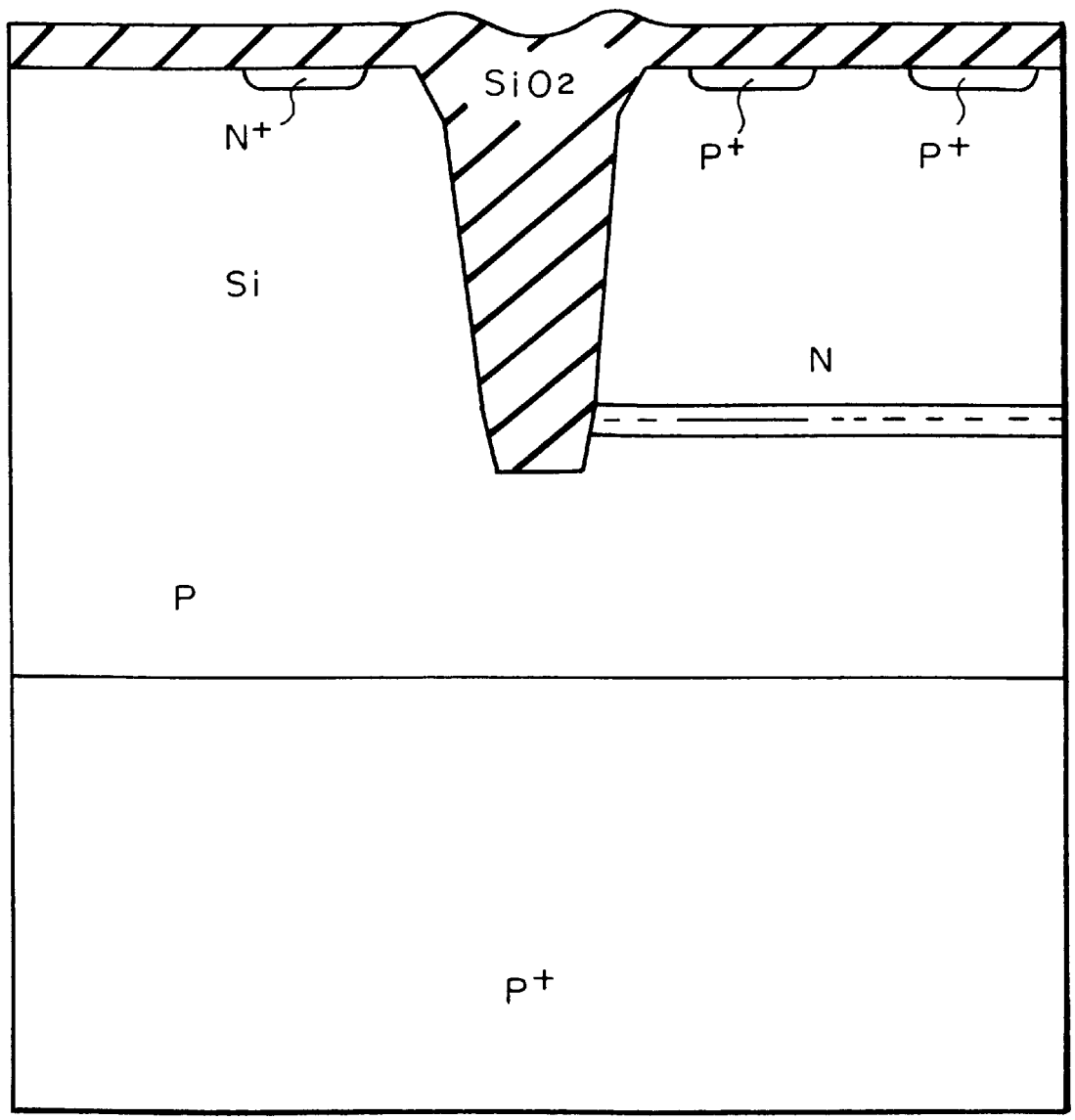
FIG. 3A is a cross-sectional view of a semiconductor device for explaining step 201 of FIG. 2.
Figure 3B:
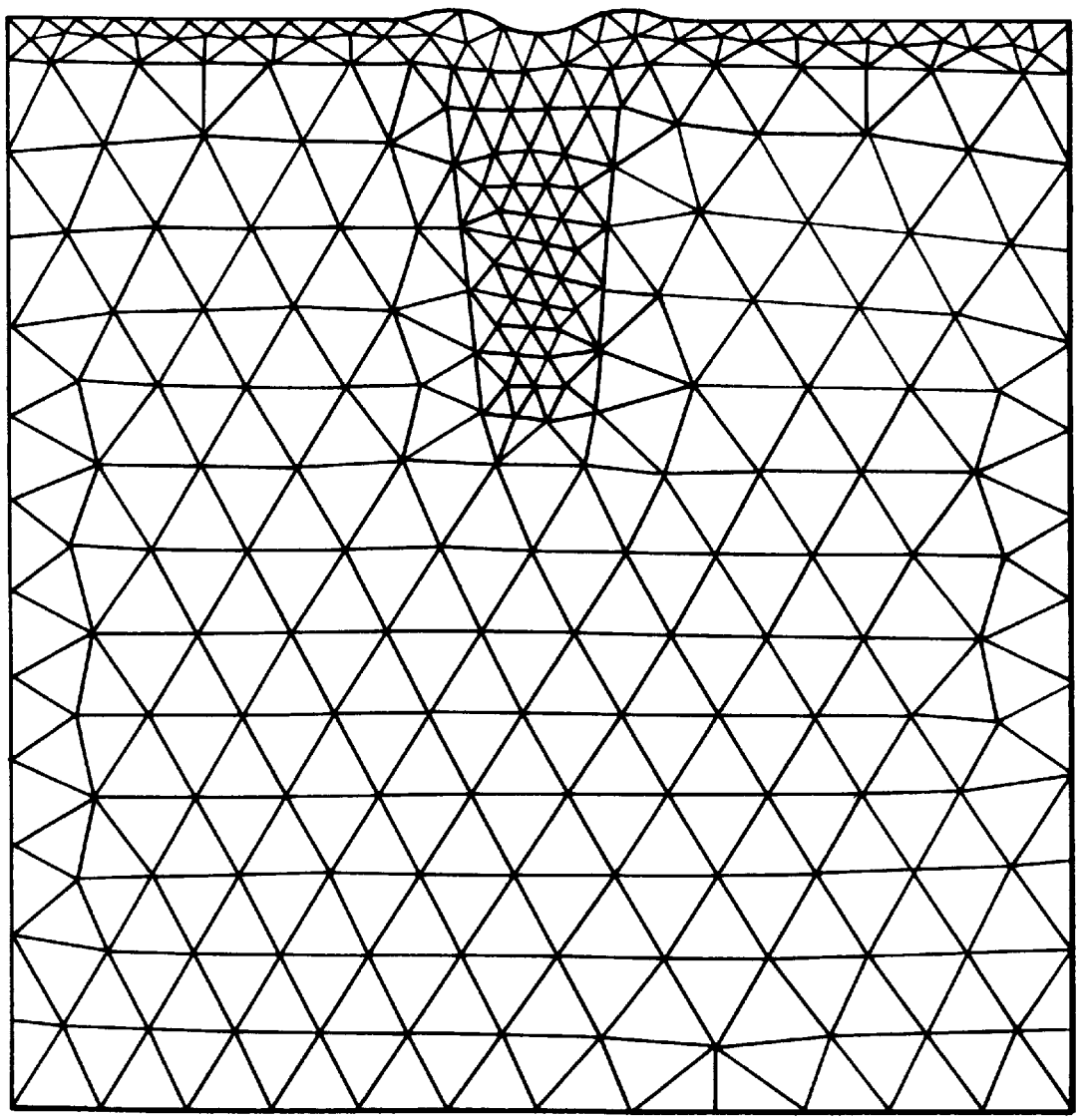
FIG. 3B is a diagram showing an example of a triangular mesh configuration of the semiconductor device of FIG. 3A.

First, at step 201, an initialization is carried out. That is, an initial triangular mesh configuration is set in a semiconductor device. For example, if the semiconductor device is as shown in FIG. 3A, the triangular mesh configuration is as shown in FIG. 3B. Particularly, a trench structure can be accurately represented by the triangular mesh configuration (see: C. S. Rafferty et al., "Iteractive Methods in Semiconducter Device Simulation", IEEE Transactions on Electron Devices, Vol. ED-32, No. 10, pp. 2018–2027, October 1985).

Figure 4A:
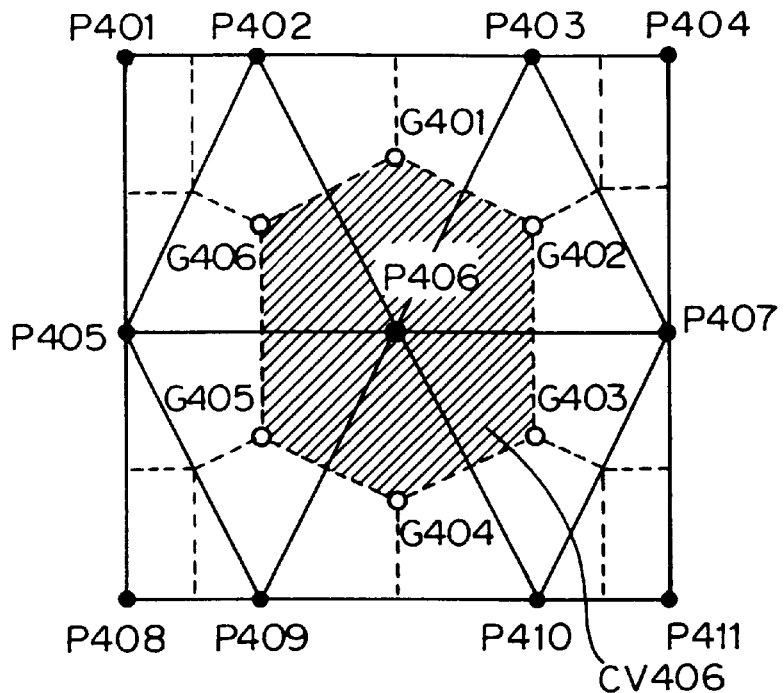
FIG. 4A is a diagram showing a control volume of the semiconductor device of FIG. 3B.
Figure 4B:
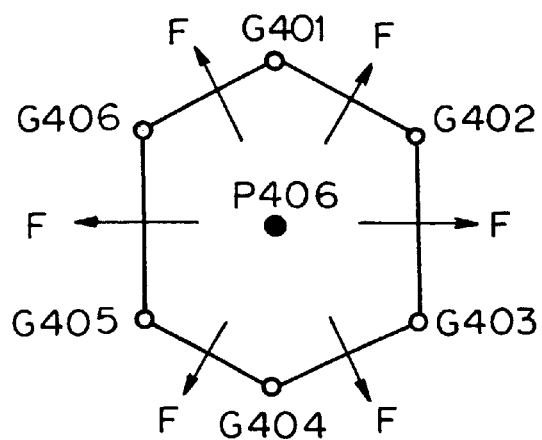
FIG. 4B is a diagram showing an impurity flux of the control volume of FIG. 4A.
Figure 5:
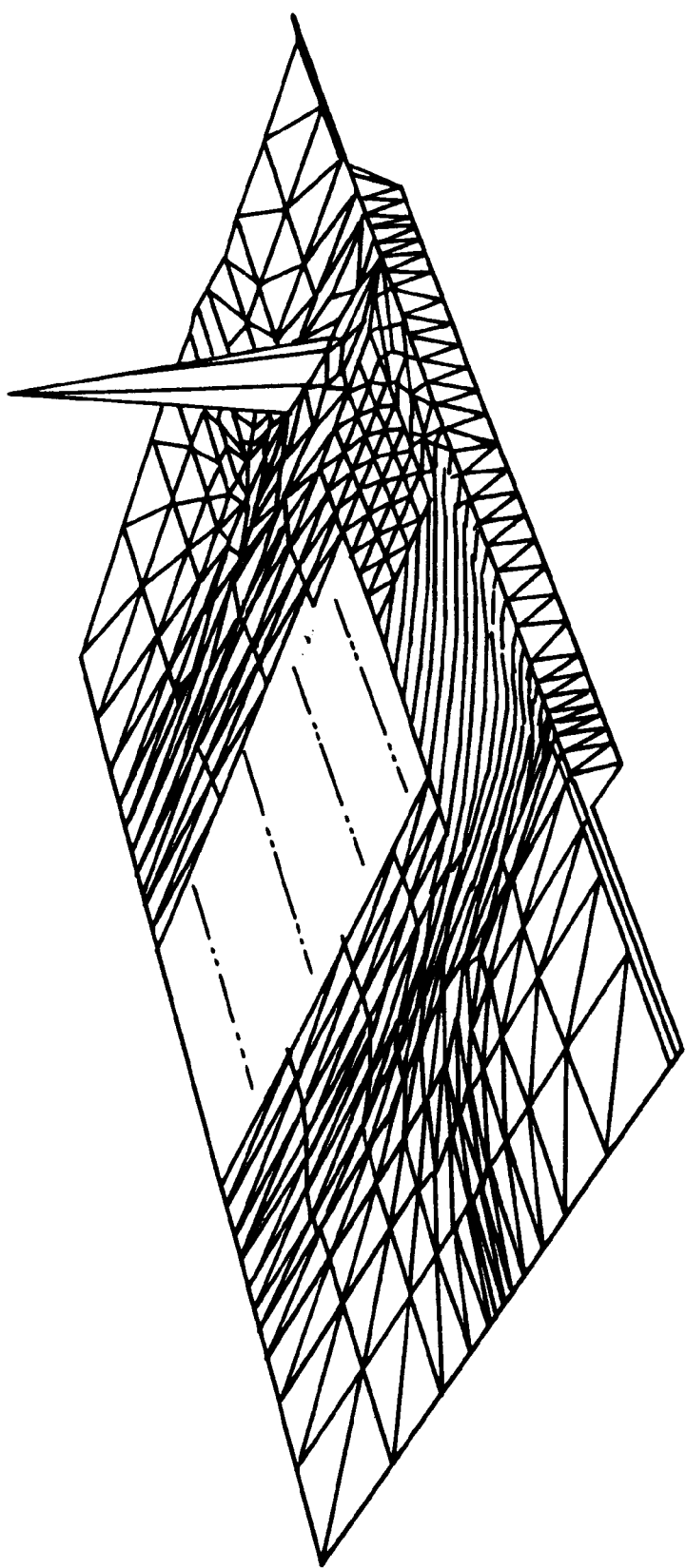
FIG. 5 is a potential diagram showing a spike which is an artifact of the simulation.

Also, at step 201, a control volume is set in each grid. That is, as shown in FIG. 4A, if grids P401 through P411 are given, a control volume CV406 is set for the grid P406. In this case, a closed surface of the control volume CV406 is defined by circumcenters G401 through G406. For example, the circumcenter G401 is a center of a circle that is circumscribed about a triangle formed by the grids P402, P403 and P406. Note that, if an impurity transport flux F is defined at the surface at each control volume as illustrated in FIG. 4B, the Gaussian theorem is represented by $$\partial C/\partial t = -\text{div } \vec{F} \quad (1)$$

where C is a concentration of impurities in the control volume. Also, $$\Sigma C_i \cdot V_i = D_{total} \quad (2)$$

where $V_i$ is a magnitude of the control volume having an impurity concentration $C_i$, $D_{total}$ is a total amount of impurites doped in the semiconductor device, and $\Sigma$ is carried out over all of the control volumes. In order to satisfy the equations (1) and (2), the grids have to satisfy Delaunay's division where one of the control volumes is never superimposed onto the other, i.e., one circumscribed circle of a triangle formed by three grids does not include any other grids. If the grids do not satisfy the Delaunay's division, an unexpected potential protrusion may be generated as shown in FIG. 5. Regarding Delaunay's division, reference is made to M. S. Mock, "Tetrahedral elements and the Scharfetter-Gummel method", Proceeding of the NASECODE IV, pp. 36–47, 1985.

Further, at step 201, initial impurity concentrations are set for the control volumes.

Still further, at step 201, a time period is initialized at a unit time $\Delta t$.

Next, at step 202, the semiconductor device, i.e., the triangle mesh configuration is deformed by assuming an execution of an oxidation process thereupon. Concretely, the locations of the grids are changed, and the control volumes thereof are also deformed. The deformation of the grids can be calculated by solving a diffusion equation of oxygen within a silicon oxide layer and a reaction equation of oxygen and silicon at a $SiO_2/Si$ interface, for example.

Next, at step 203, the impurity concentrations of the deformed control volumes are changed. That is, a volume ratio $\alpha$ of one original control volume to its deformed control volume is calculated, and the impurity concentration C of this deformed control volume is renewed by $$C \leftarrow \alpha C$$

For example, if the deformed control volume is increased ($\alpha<1$), its impurity concentration is diluted. Contrary to this, if the deformed control volume is decreased ($\alpha>1$), its impurity concentration is enriched.

Next, at step 204, it is determined whether or not the deformed mesh configuration satisfies Delaunay's division. Only if the deformed mesh configuration does not satisfy Delaunay's division, does the control proceed to step 205. Otherwise, the control proceeds directly to step 206.

Figure 6A:
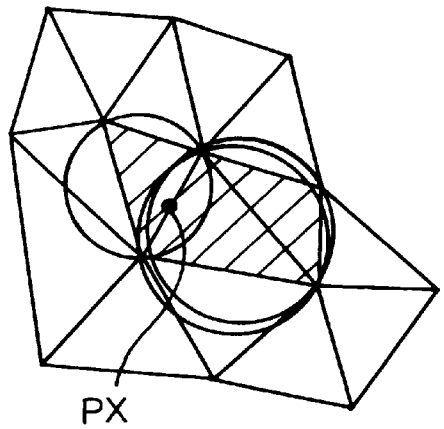
FIGS. 6A, 6B and 6C are diagrams for explaining step 205 of FIG. 2.
Figure 6B:
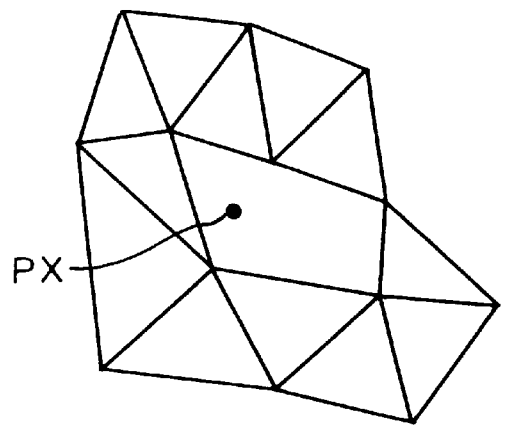
Figure 6C:
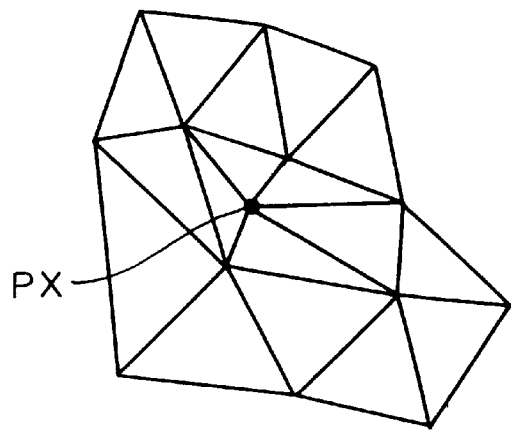

At step 205, a new mesh configuration satisfying Delaunay's division is arranged. That is, as shown in FIG. 6A, a new grid PX is added, and triangles having circumcircles including this new grid PX are searched. In FIG. 6A, three triangles are found. Then, as shown in FIG. 6B, the three triangles are canceled. Then, as shown in FIG. 6C, the grids for forming the canceled three triangles are combined with the grid PX to form five new triangles. Thus, the new mesh configuration is arranged. Then, an appropriate impurity concentration is given to the new grid PX.

Next, at step 206, impurity concentrations for the grids of the deformed or rearranged mesh configuration are calculated by the diffusion equation (1).

Next, at step 207, a time step period t is incremented by $$t \leftarrow t + \Delta t.$$

Next, at step 208, it is determined whether or not the total time period $\Sigma \Delta t_i$ reaches a predetermined time period. As a result, if the predetermined time period has passed, the control proceeds to step 209. Otherwise, the control returns to step 202, thus repeating the above-mentioned operations at steps 202 to 207.

At step 209, a simulation result is outputted to the output unit 3.

Then, the routine of FIG. 2 is completed by step 210.

In the above-mentioned prior art impurity diffusion simulation method, however, after the new mesh configuration is arranged, the control volumes are also changed. Therefore, since the impurity concentration of the grids are not changed even when the control volumes are changed by the arrangement of the mesh configuration, the equation (2) may not be satisfied, which makes the impurity concentration inaccurate.

Figure 8:
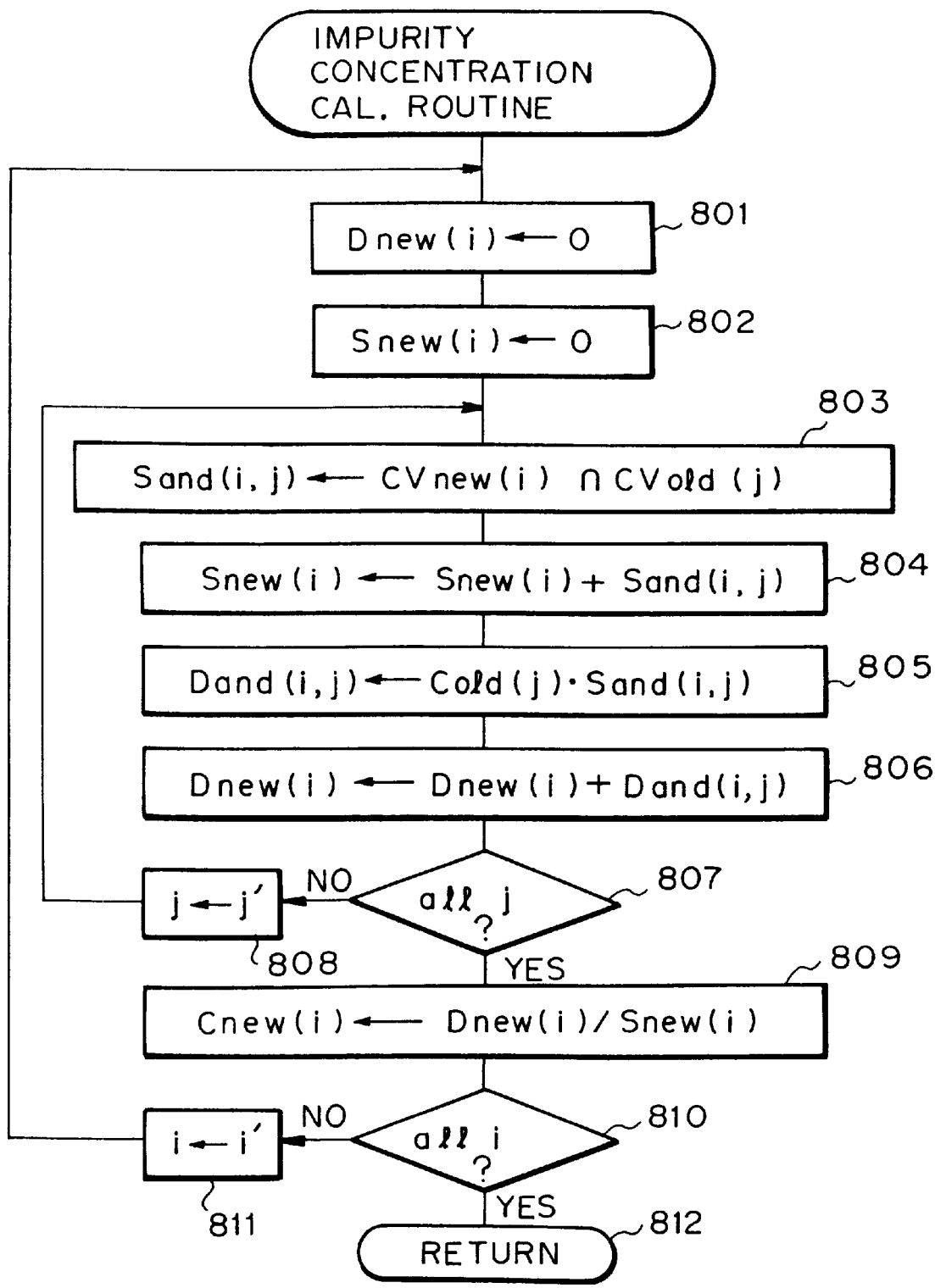
FIG. 8 is a detailed flowchart of step 701 of FIG. 7.

In FIG. 7, which is a flowchart showing a proposed impurity diffusion simulation method (see Japanese Patent Application No. 7-161336 filed by NEC Corporation on Jun. 28, 1995 which was published as JP-A-9-17738 on Jan. 17, 1997), step 701 is added to the flowchart of FIG. 2, and is illustrated in detail in FIG. 8.

The flowcharts of FIGS. 7 and 8 will be explained next with reference to FIGS. 9A through 9G.

Figure 9A:
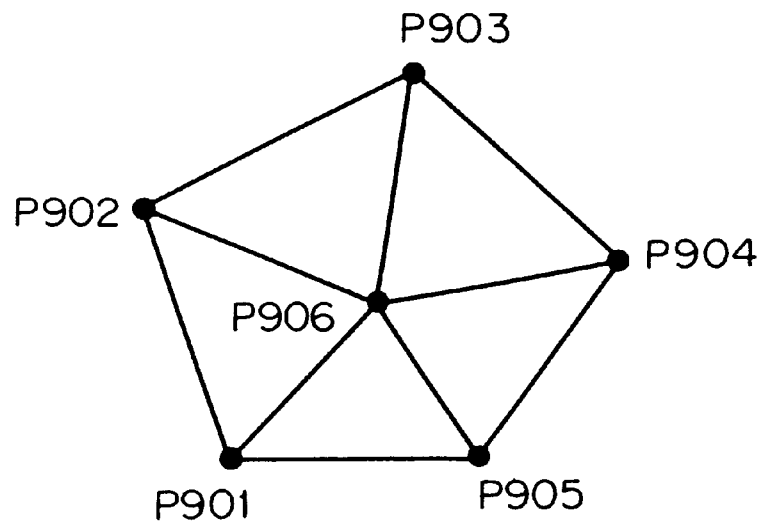
FIGS. 9A through 9G are diagrams for explaining the flowcharts of FIGS. 7 and 8.
Figure 9B:
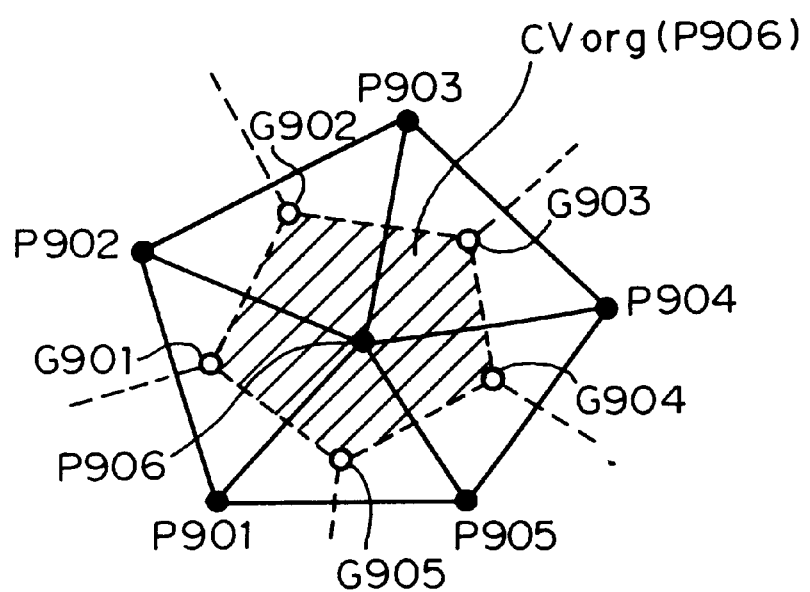

First, at step 201, assume that an original mesh configuration as illustrated in FIG. 9A is established. The original mesh configuration is formed by grids P901 through P906. In this case, as illustrated in FIG. 9B, circumcenters G901, G902, . . . , and G905 are defined for a triangle formed by the grids P901, P902 and P906, a triangle formed by the grids P902, P903 and P906, . . . , and a triangle formed by the grids P905, P901 and P906, respectively. Therefore, a control volume $CV_{org}$ belonging to the grid P906 is defined by a shaded portion in FIG. 9B.

Figure 9D:
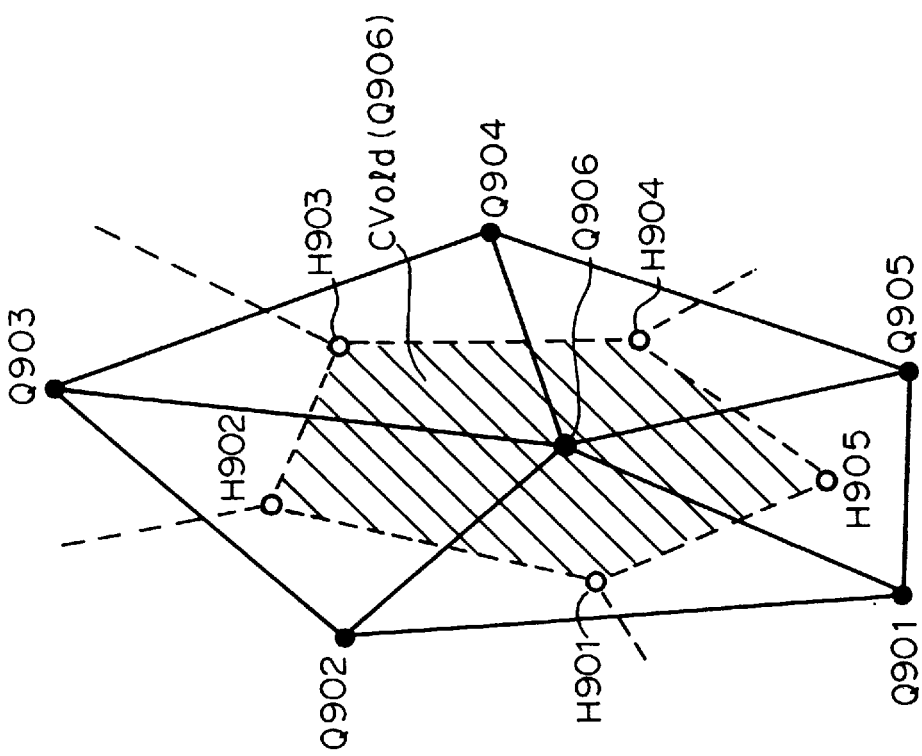
Figure 9C:
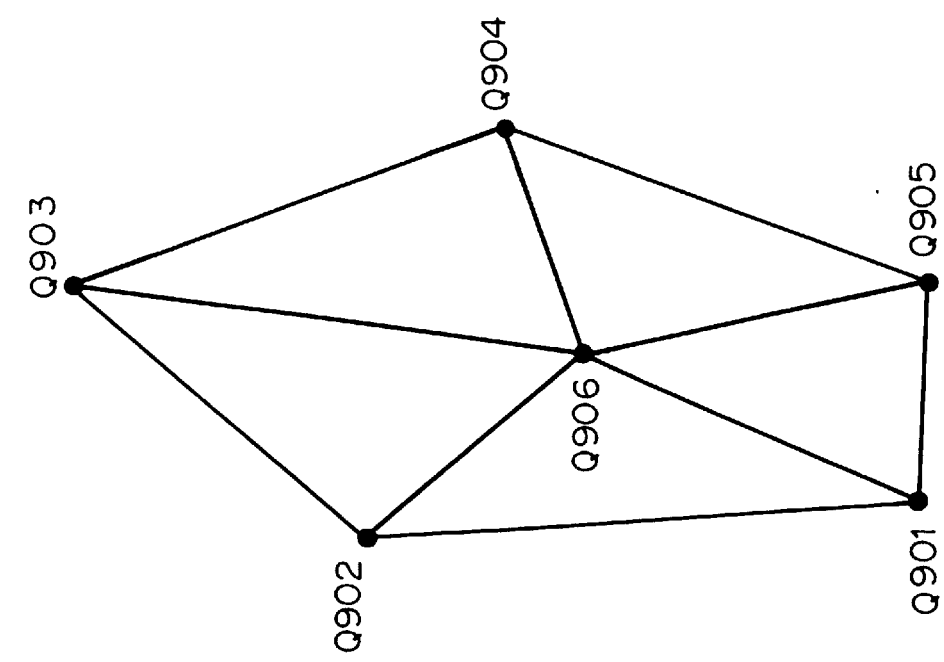

Next, at step 202, the original mesh configuration as illustrated in FIG. 9A is deformed into a mesh configuration formed by grids Q901, Q902, ..., and Q906 as illustrated in FIG. 9C, and as a result, the control volume $CV_{org}$ as illustrated in FIG. 9B is changed to a control volume $CV_{old}$ belonging to the grid Q906 defined by circumcenters H901, H902, ..., and H905.

Next, at step 203, the impurity concentration of the control volume $CV_{old}$ is calculated by $$C_{old} = (CV_{org}/CV_{old}) \cdot C_{org}$$

Figure 9F:
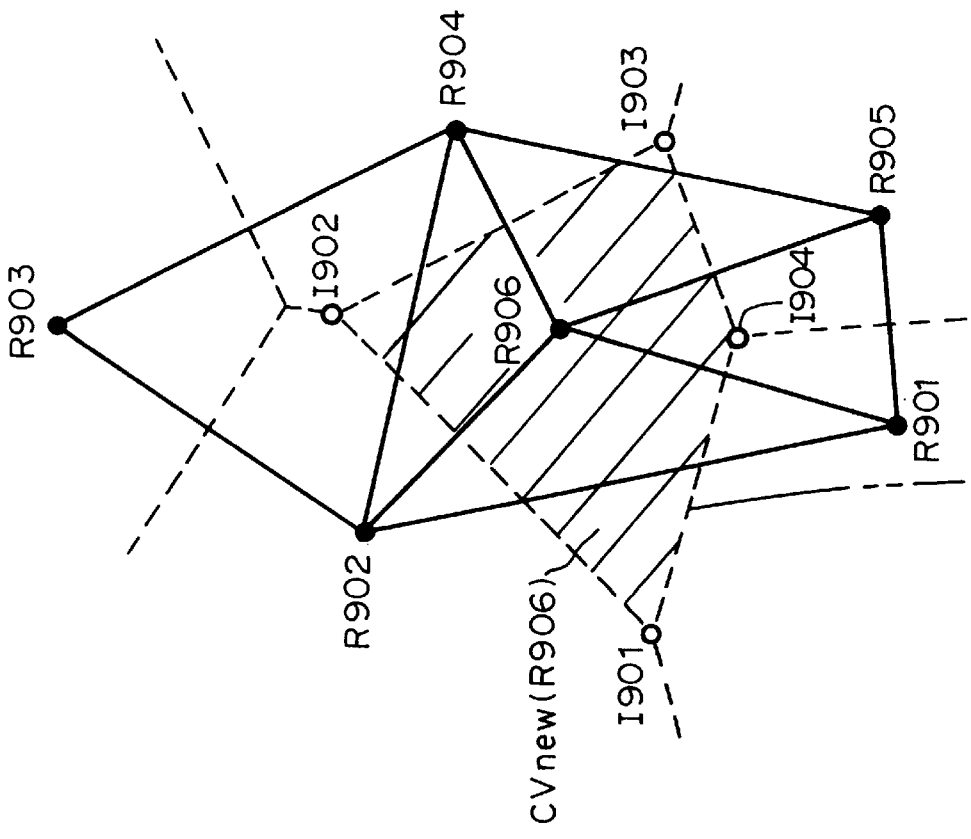
Figure 9E:
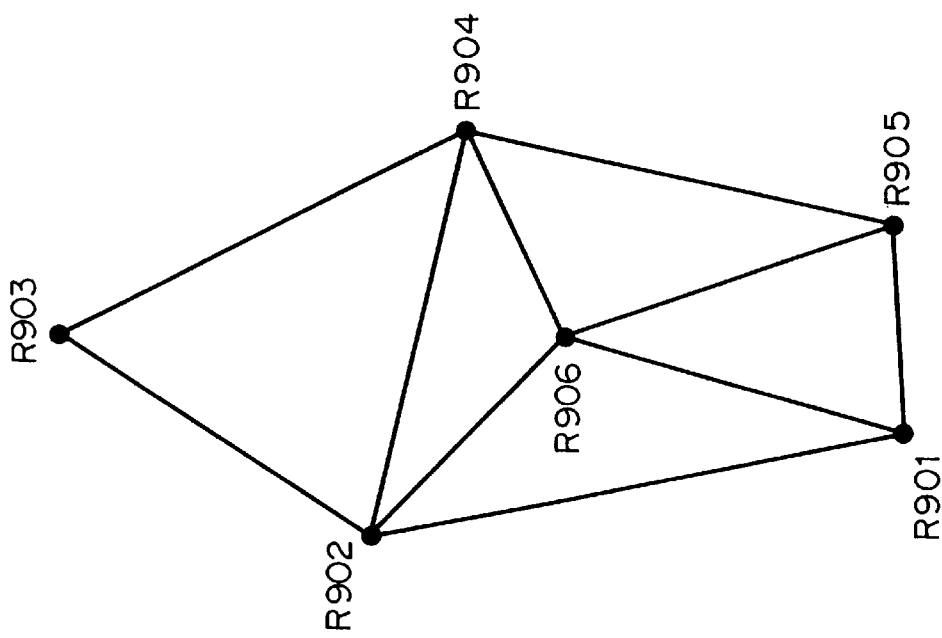

Next, the control proceeds via step 204 to step 205 which rearranges the mesh configuration as illustrated in FIG. 9C into a mesh configuration formed by grids R901, R902, ..., and R906 as illustrated in FIG. 9E, and as a result, the control volume $CV_{org}$ as illustrated in FIG. 9D is changed to a control volume $CV_{new}$ belonging to the grid R906 defined by circumcenters I901, I902, ..., and I905.

Next, the control proceeds to step 701 which will be explained next with reference to FIG. 8.

For example, in order to calculate an impurity concentration of the control volume $CV_{new}(R906)$, at step 801, an impurity amount $D_{new}(R906)$ of the control volume $CV_{new}(R906)$ is cleared, i.e., $D_{new}(R906) \leftarrow 0$.

Next, at step 802, a region $S_{new}(R906)$ of the control volume $CV_{new}(R906)$ is cleared, i.e., $S_{new}(R906) \leftarrow 0$.

Figure 9G:
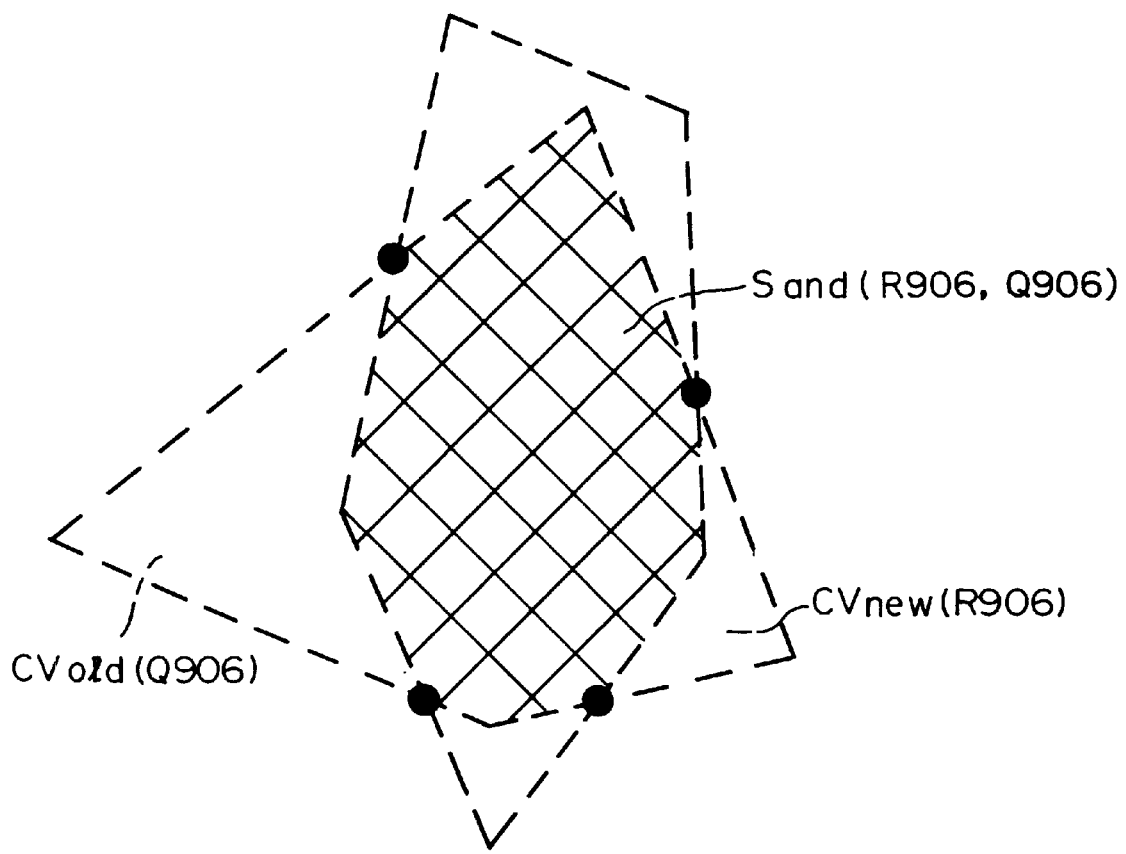

Next, at step 803, a product region $S_{and}(R906, j)$ is calculated by $S_{and}(R906, j) \leftarrow CV_{new}(R906) \cap CV_{old}(j)$ For example, if j=Q906, the product region $S_{and}(R906, Q906)$ is as illustrated in FIG. 9G.

Next, at step 804, the region $S_{new}(R906)$ is renewed by $S_{new}(R906) \leftarrow S_{new}(R906) + S_{and}(R906, j)$.

Next, at step 805, an impurity amount $D_{and}(R906, j)$ included in the product region $S_{and}(R906, j)$ is calculated by $D_{and}(R906, j) \leftarrow C_{old}(Q906) \cdot S_{and}(R906, j)$ where $C_{old}(Q906)$ is an impurity concentration of the control volume Q906 of FIG. 9D.

Next, at step 806, the impurity amount $D_{new}(R906)$ is renewed by $D_{new}(R906) \leftarrow D_{new}(R906) + D_{and}(R906, j)$.

Steps 807 and 808 repeat the control at steps 803 through 806 over all the grids of FIGS. 9C and 9D. That is, generally, $$D_{new}(i) = jC_{old}(j) \cdot S_{and}(i, j) \qquad (3)$$

Next, at step 809, an impurity concentration $C_{new}$ of the control volume $CV_{new}$ at the grid R906 is calculated by $C_{new}(R906) \leftarrow D_{new}(R906) / S_{new}(R906)$ Steps 810 and 811 repeat the control at steps 801 through 809 over all the grids of FIGS. 9E and 9F. That is, generally, $C_{new}(i) = D_{new}(i) / S_{new}(i)$ Then, at step 812, the routine of FIG. 8 is returned to step 206 of FIG. 7.

According to the proposed impurity diffusion simulation method as illustrated in FIGS. 7 and 8, if a deformed mesh configuration is within a certain range, the total amount of impurities is preserved between the deformed mesh configuration and its non-deformed mesh configuration.

Figure 10A:
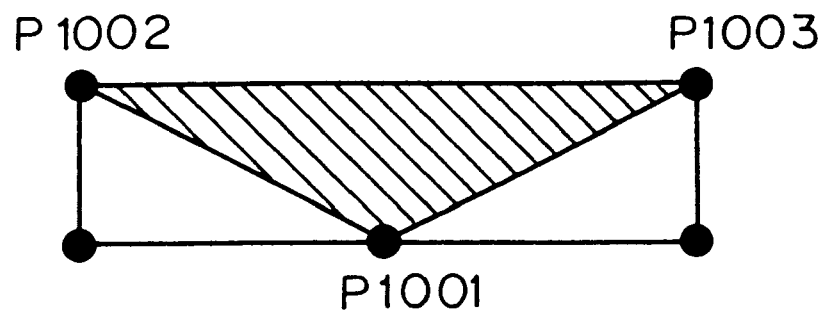
FIGS. 10A and 10B are diagrams of mesh configurations for explaining an inversion of a mesh configuration.
Figure 10B:
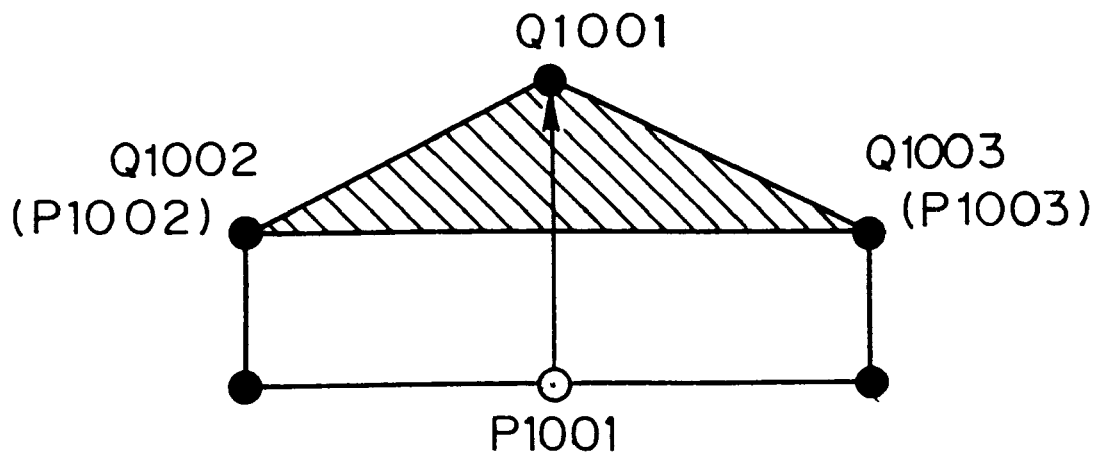

In the proposed impurity diffusion simulation method as illustrated in FIGS. 7 and 8, however, if the deformed mesh configuration is overlapped with its non-deformed mesh configuration or inverted, the total amount of impurities is not preserved between the deformed mesh configuration and the non-deformed mesh configuration. Note that overlapping of mesh configurations occurs in a trench structure device. Also, inverting of mesh configurations is illustrated in FIGS. 10A and 10B. That is, a non-deformed mesh configuration having grids P1001, P1002 and P1003 as illustrated in FIG. 10A is changed into a deformed mesh configuration having grids Q1001, Q1002 and Q1003 as illustrated in FIG. 10B, In this case, the grids Q1002 and Q1003 are the same as the grids P1002 and P1003, respectively, and the grid P1001 crosses a line between the grids P1002 and P1003 (Q1002 and Q1003) to become the grid Q1001. As a result, a triangle formed by the grids P1001, P1002 and P1003 is inverted into a triangle formed by the grids Q1001, Q1002 and Q1003.

The impurity diffusion simulation method as illustrated in FIGS. 7 and 8 applied to a case where an inverted mesh configuration occurs will be explained next with reference to FIGS. 11A through 11G which correspond to FIGS. 9A through 9G, respectively.

Figure 11A:
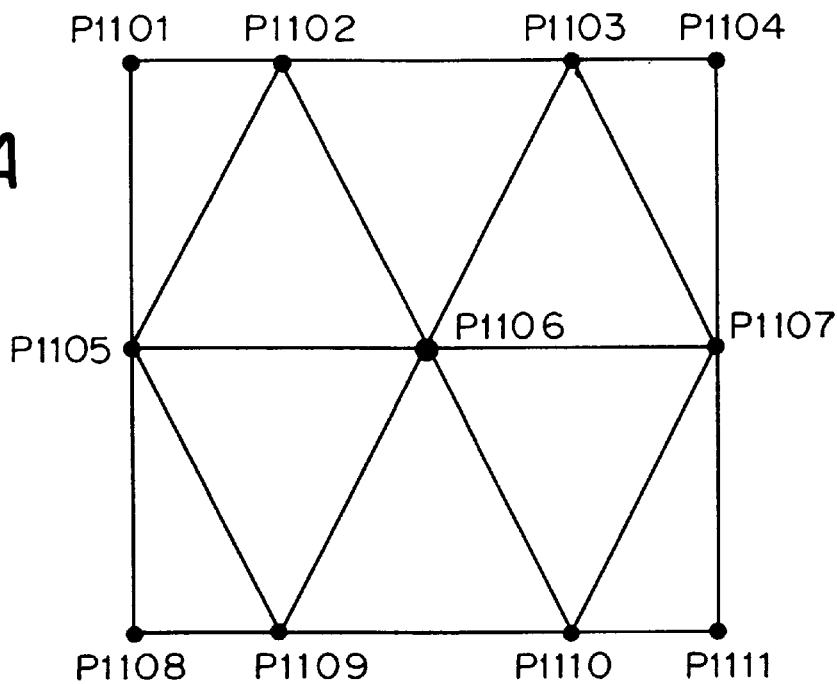
FIGS. 11A through 11G are other diagrams for explaining the flowcharts of FIGS. 7 and 8.
Figure 11B:
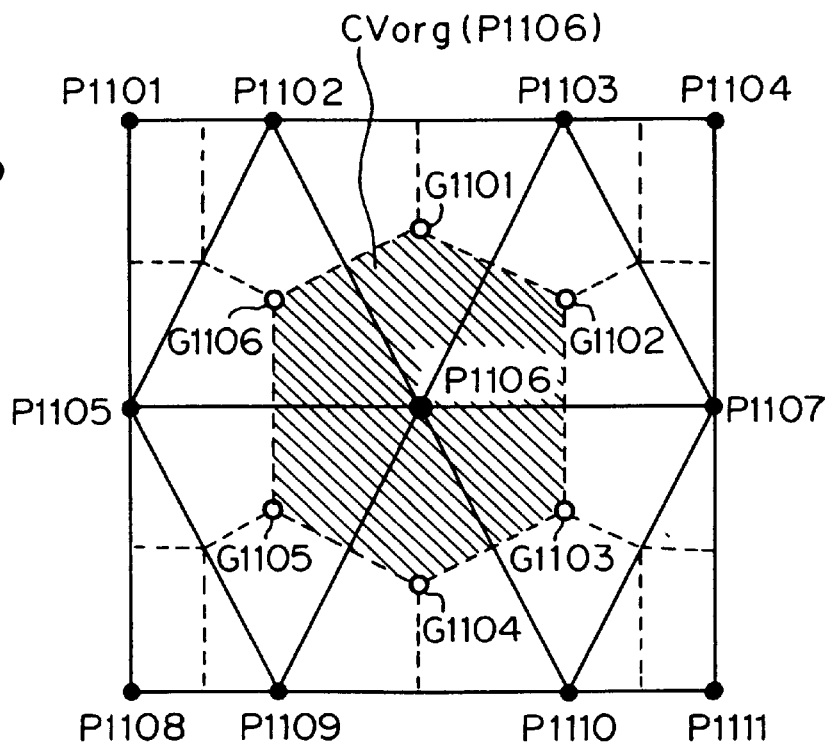

First, at step 201, assume that an original mesh configuration as illustrated in FIG. 11A is established. The original mesh configuration is formed by grids P1101 through P1111. In this case, as illustrated in FIG. 11B, circumcenters G1101, G1102, ..., and G1106 are defined. Therefore, a control volume $CV_{org}$ belonging to the grid P1106 is defined by a shaded portion in FIG. 11B.

Figure 11C:
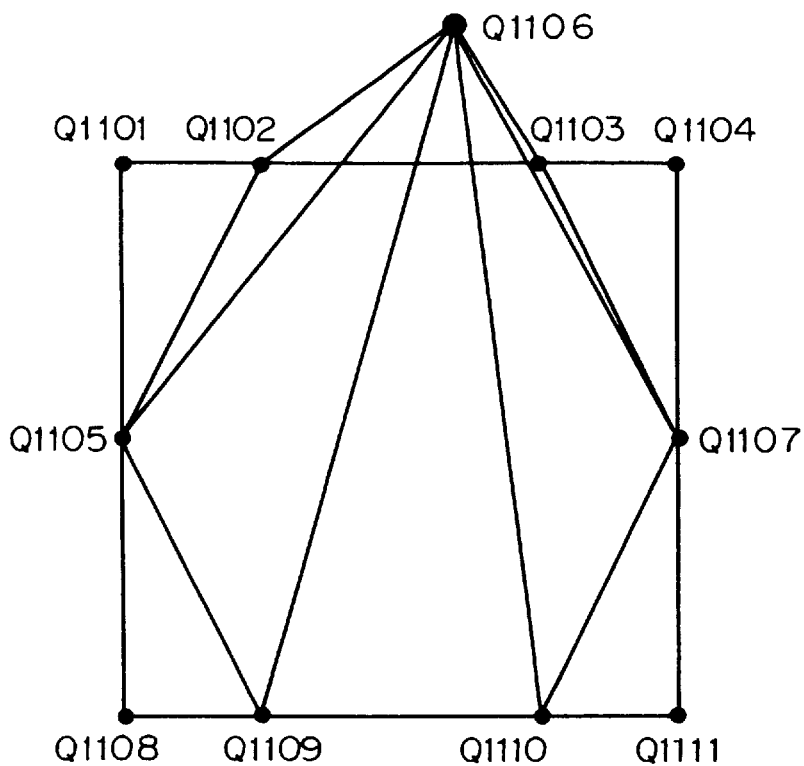

Next, at step 202, the original mesh configuration as illustrated in FIG. 11A is deformed into a mesh configuration formed by grids Q1101, Q1102, ..., and Q1106 as illustrated in FIG. 11C. In this case, the grids Q1101 through Q1111 except for the grid Q1106 are the same as the grids P1101 through P1111 except for the grid P1106, and the grid Q1106 is beyond the line defined by the grids Q1102 and Q1103 (P1102 and P1103). In other words, a triangle formed by the grids P1102, P1103 and P1106 of FIG. 11A is inverted into a triangle formed by the grids Q1102, Q1103 and Q1106 of FIG. 11C. As a result, the control volume $CV_{org}$ as illustrated in FIG. 11B is changed to a control volume $CV_{old}$ belonging to the grid Q1106 defined by circumcenters H1101, H1102, ..., and H1106.

Next, at step 209, the impurity concentration of the control volume $CV_{old}$ is calculated by $$C_{old} = (CV_{org}CV_{old}) \cdot C_{org}$$

Figure 11D:
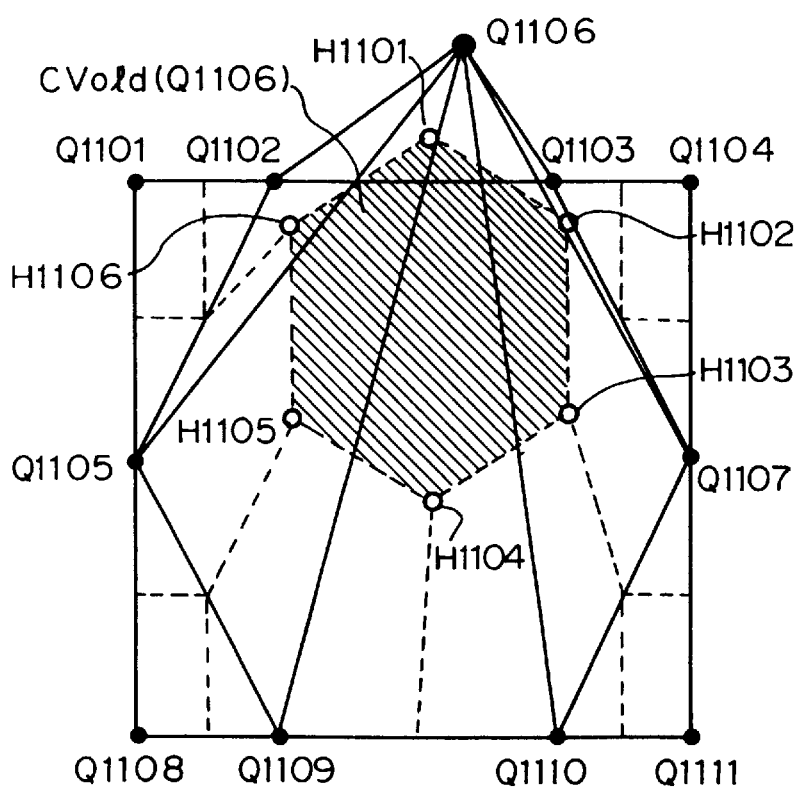
Figure 11E:
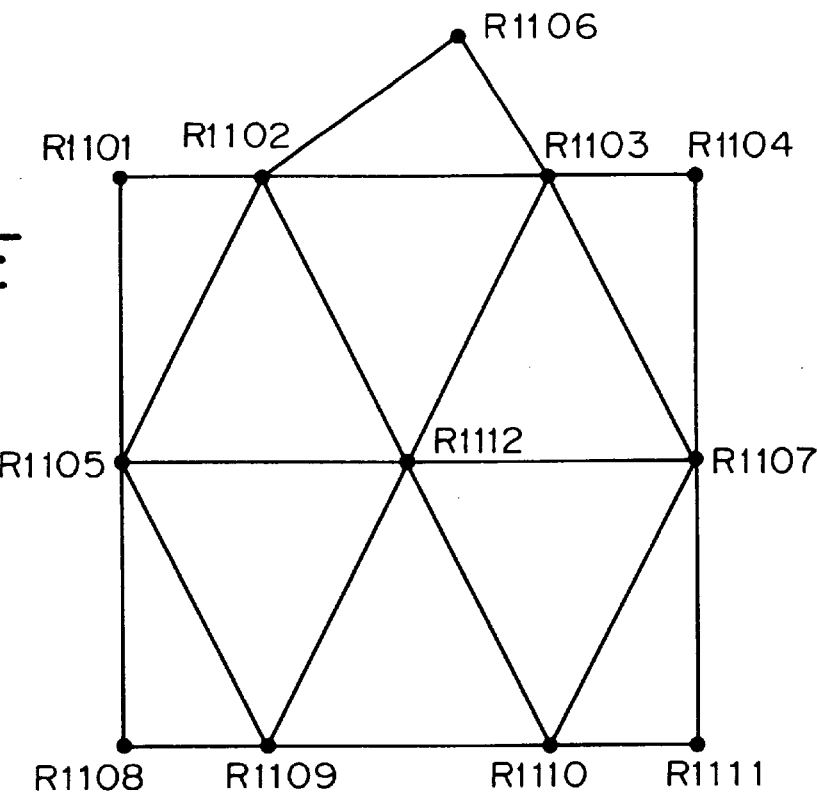
Figure 11F:
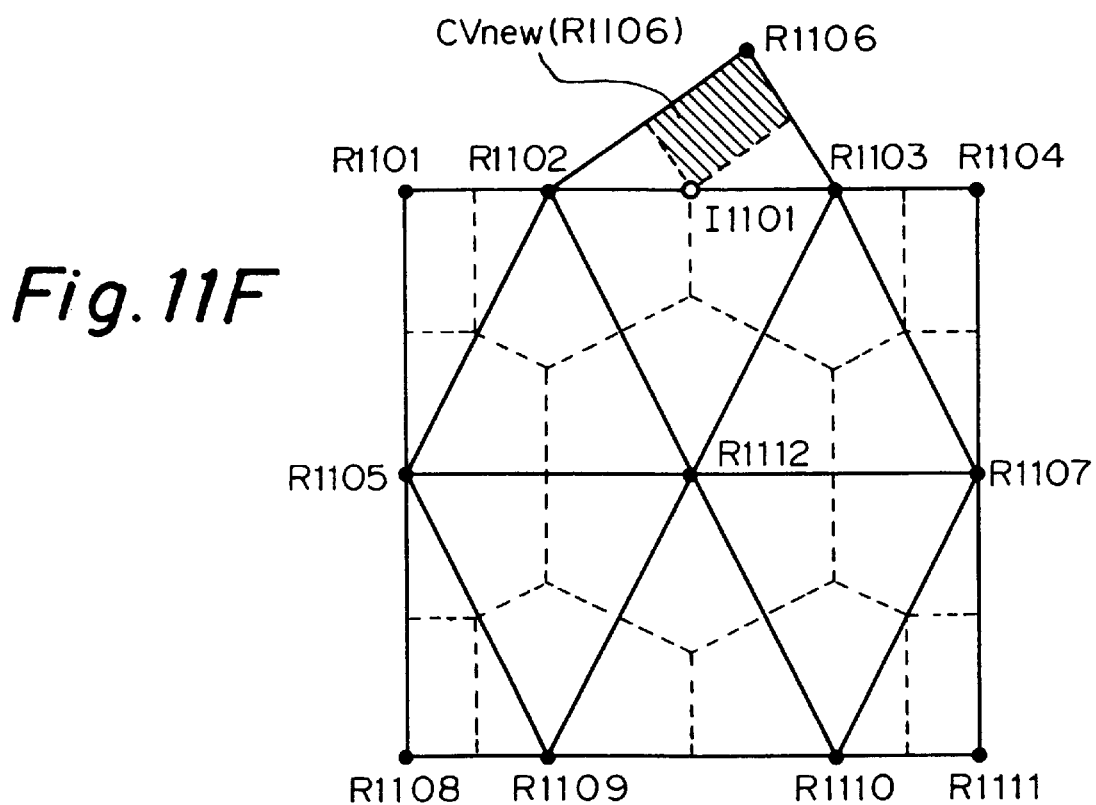

Next, the control proceeds via step 204 to step 205 which rearranges the mesh configuration as illustrated in FIG. 11C into a mesh configuration formed by grids R1101, R1102, ..., and R1112 as illustrated in FIG. 11E. In this case, the grids R1101 through R1111 are the same as the grids Q1101 through Q1111, respectively, and the grid R1112 is added. As a result, the control volume $CV_{org}$ as illustrated in FIG. 11D is changed to a control volume $CV_{new}$ belonging to the grid R1106 defined by a circumcenter I1101 and other circumcenters (not shown). In this case, the control volume $CV_{new}$ is defined only within a triangle formed by the grids R1102, R1103 and R1106, since impurities are not present outside of the semiconductor device.

Figure 11G:
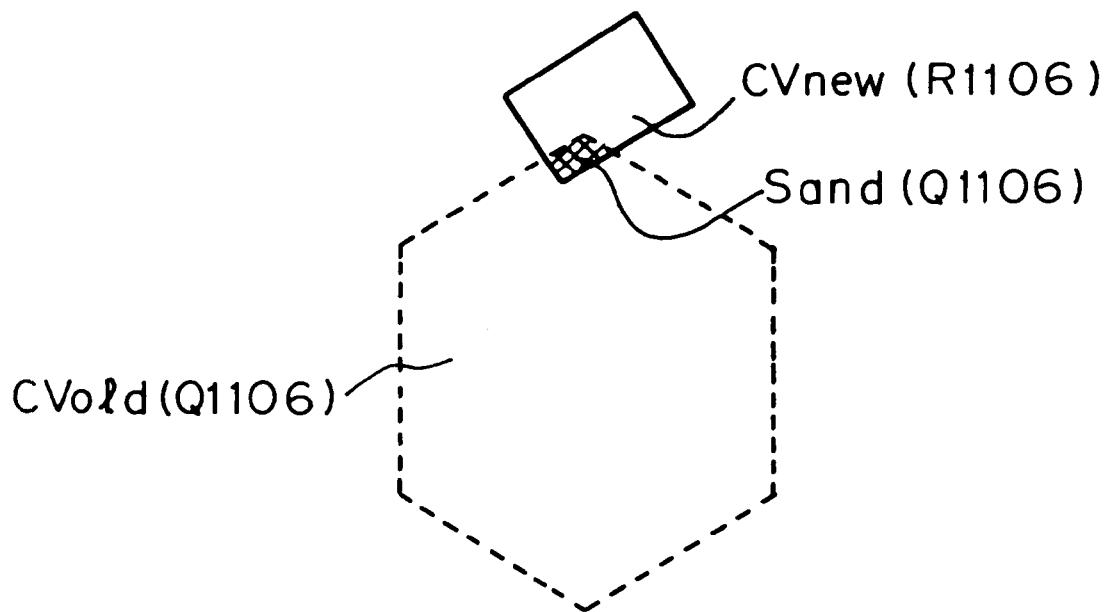

Next, referring to FIG. 11G, the control volume $CV_{new}(R1106)$ superposes onto only the control volume $CV_{old}(Q1106)$. In other words, the control volumes $CV_{old}$ other than the control volume $CV_{old}(Q1106)$ are not defined in the control volume $CV_{new}(R1106)$. Therefore, by the flowchart of FIG. 8, $$D_{new}(R1106)=C_{old}((Q1106) \cdot S_{and}(Q1106))$$

where $S_{and}(Q1106)$ is illustrated by a shaded portion in FIG. 9G. Therefore, $$C_{new}(R1106)=D_{new}(R1106)/S_{new}(R1106)=\\C_{old}(Q1106) \cdot S_{and}(Q1106)/S_{new}(R1106)$$

where $S_{new}(R1106)$ is the total region of the control volume $CV_{new}(R1106)$. Since $$S_{and}(Q1106) / S_{new}(R1106) < 1,$$

then, the impurity concentration $C_{new}(R1106)$ of the control volume $CV_{new}(R1106)$ is remarkably smaller than a practical value.

Figure 12:
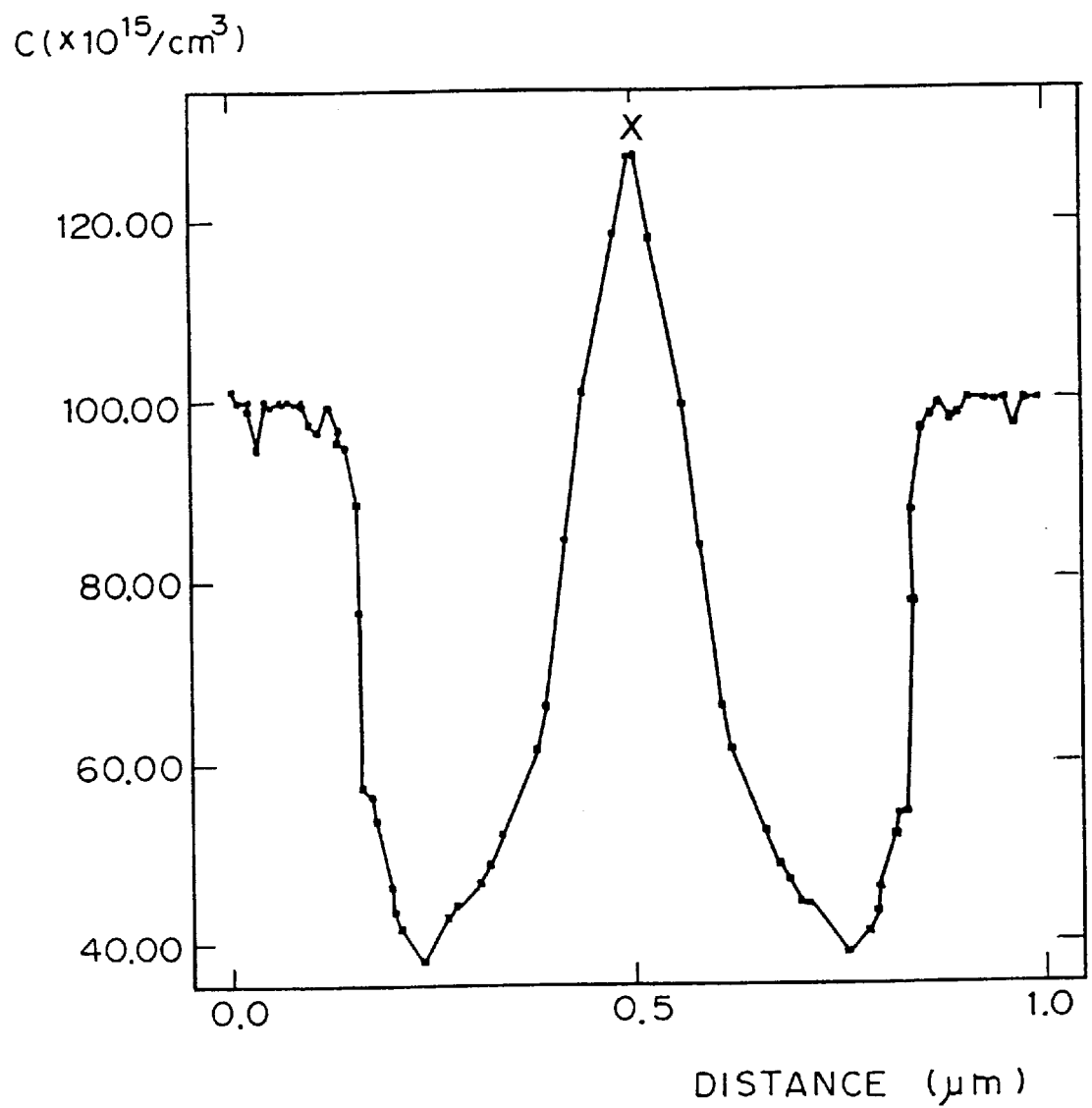
FIG. 12 is a diagram showing a simulation result obtained by the flowcharts of FIGS. 7 and 8.

Also, when the impurity diffusion simulation method as illustrated in FIGS. 7 and 8 is applied to an overlapping case, a control volume $CV_{new}$ is superimposed onto two control volumes $CV_{old}$. As a result, the impurity concentration of such a control volume $CV_{new}$ is remarkably larger than a practical value as indicated by X in FIG. 12.

Thus, in the proposed impurity simulation method as illustrated in FIGS. 7 and 8, the impurity distribution greatly fluctuates due to the inversion and overlapping of control volumes.

Figure 13:
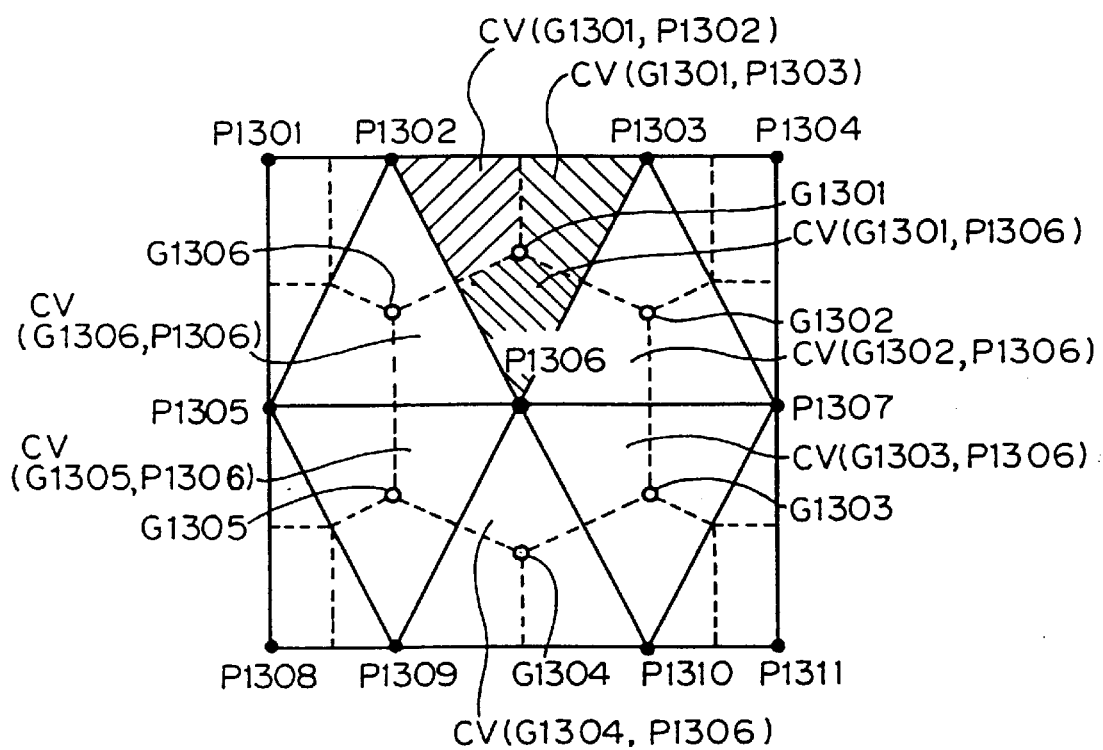
FIG. 13 is a diagram illustrating a triangular mesh configuration according to the present invention.

In FIG. 13, which illustrate a triangle mesh configuration according to the present invention, if grids P1301 through P1311 are given, three control volumes are defined for one triangle. For example, control volumnes CV(G1301, P1302), CV(G1301, P1303) and CV(G1301, P1306) are defined for a triangle formed by the grids P1302, P1303 and P1306 having a circumcenter G1301. Also, control volumes CV(G1302, P1306), CV(G1303, P1306), CV(G1304, P1306), CV(G1305, P1306), CV(G1306, P1306) in addition to the control volume CV(G1301, P1306) belong to the grid P1306. Each of the control volumes always includes one grid. Therefore, even after the triangular mesh configuration is deformed, any regions of a new control volume can be defined by old control volumes.

Figure 14A:
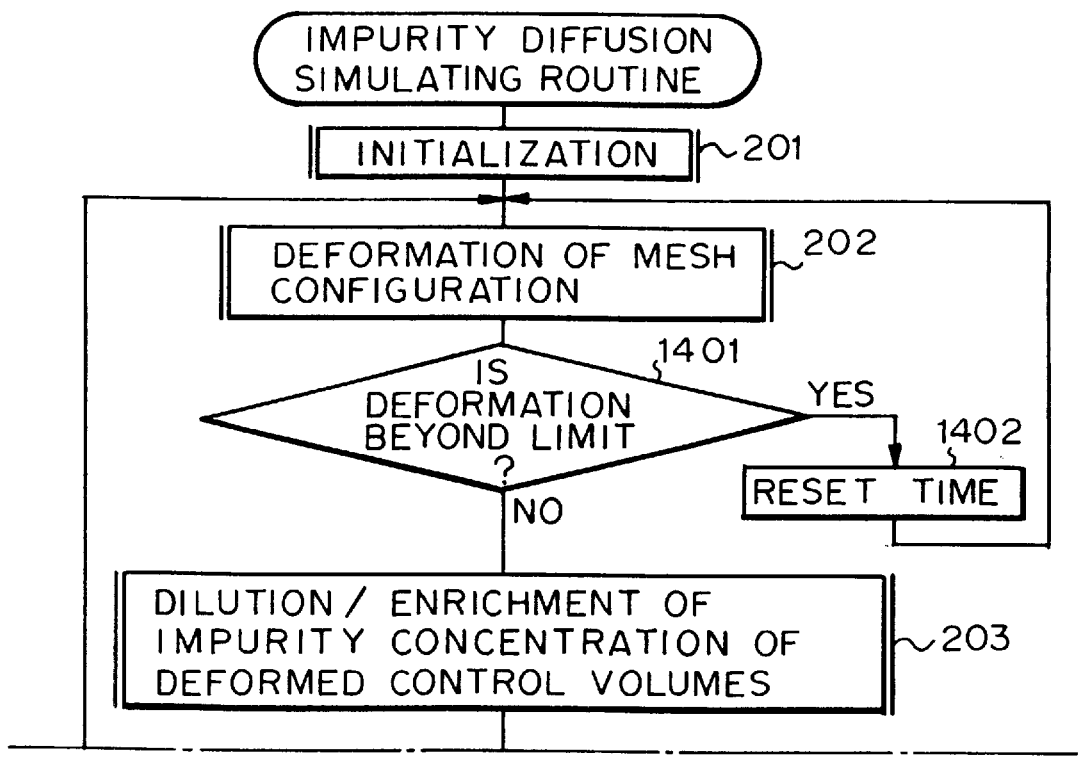
FIGS. 14A and 14B are a flowchart showing an embodiment of the impurity diffusion simulation method according to the present invention.
Figure 14B:
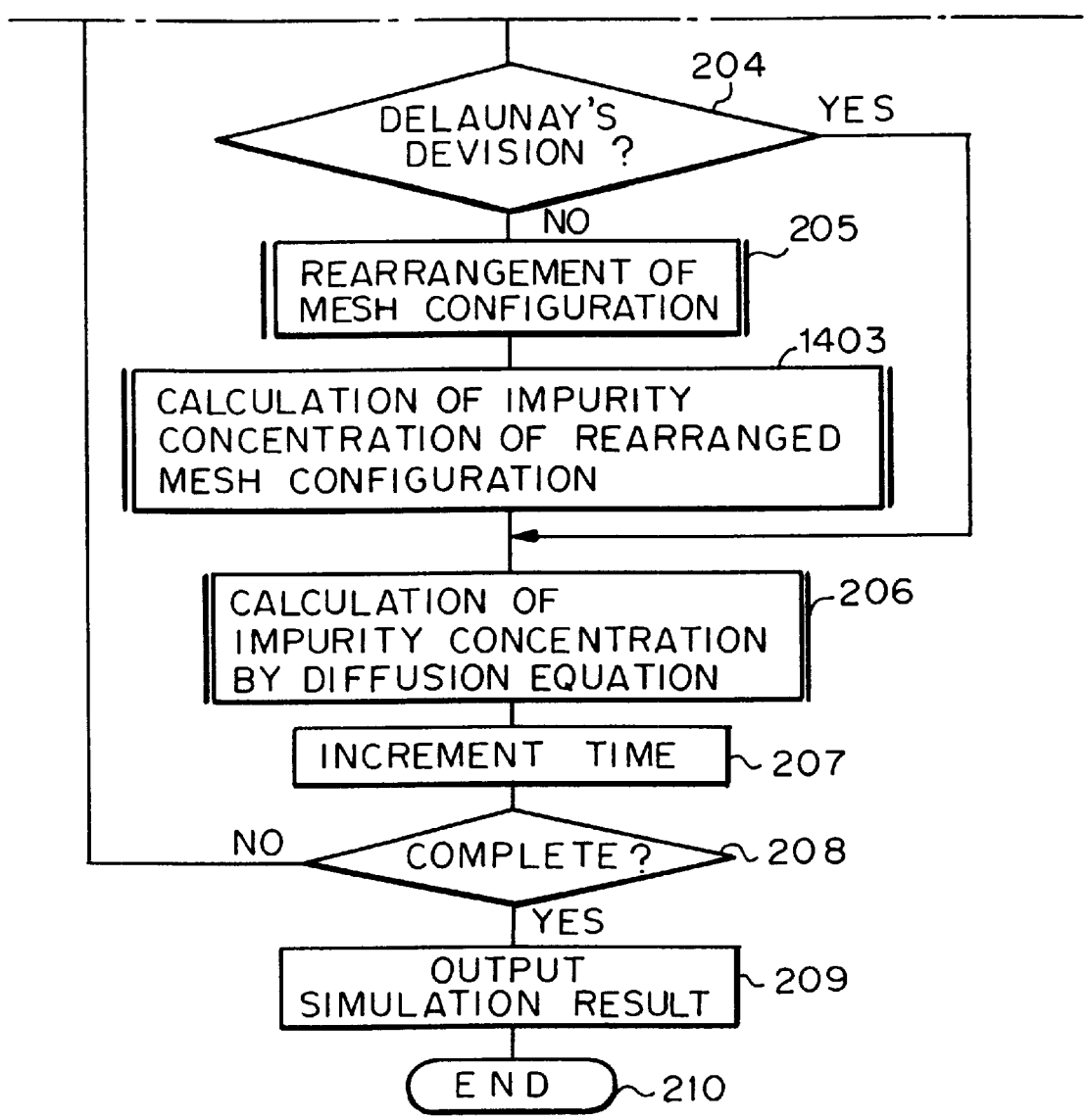
Figure 15:
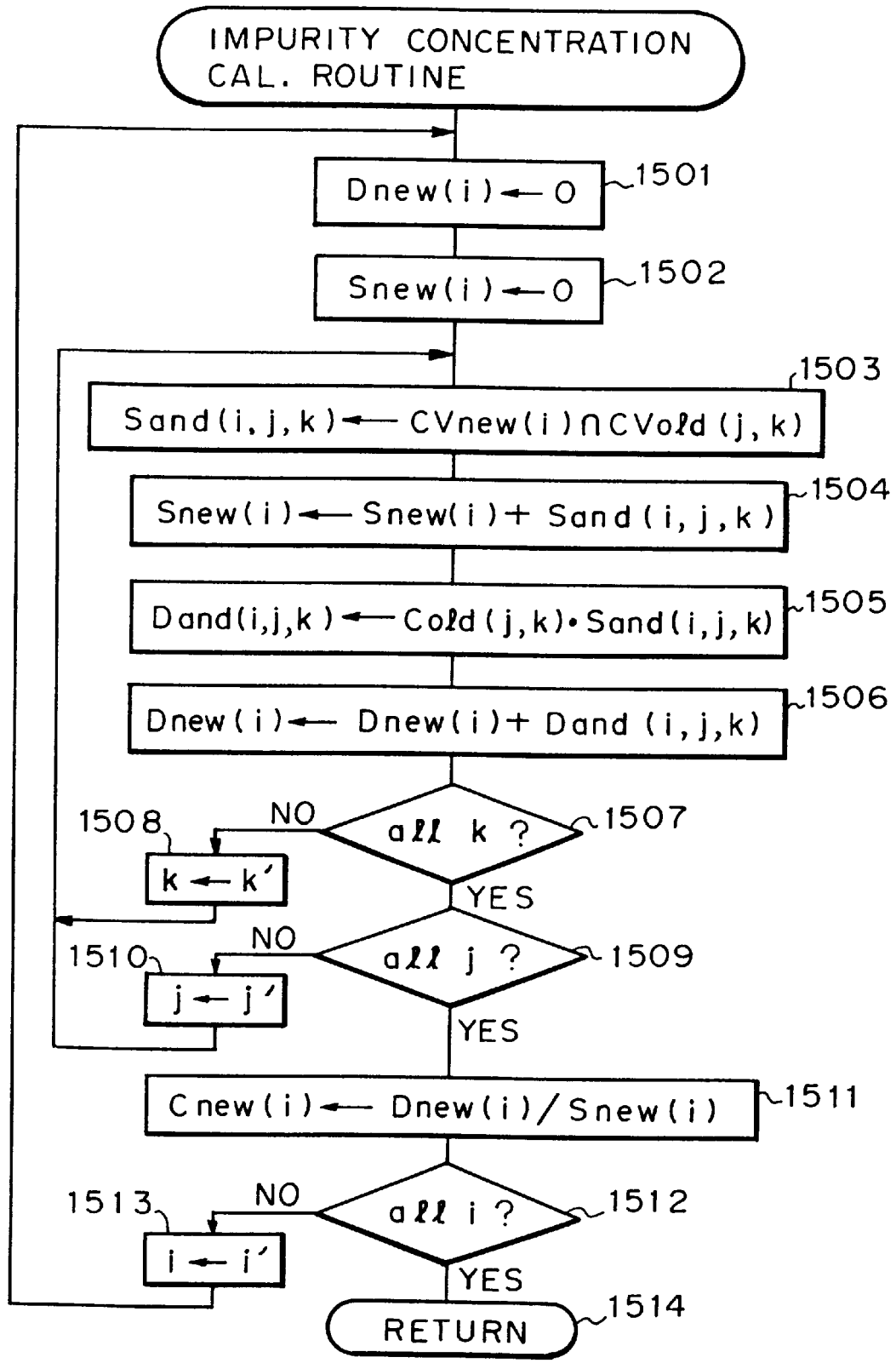
FIG. 15 is a detailed flowchart of step 1403 of FIG. 14A.

In FIG. 14, which is a flowchart showing an embodiment of the impurity diffusion simulation method according to the present invention, steps 1401 and 1402 added to the flowchart of FIG. 7 and step 701 is modified to step 1403 which and is illustrated in detail in FIG. 15.

The flowcharts of FIGS. 14A and 14B and 15 will be explained next with reference to FIGS. 16A through 16H.

Figure 16A:
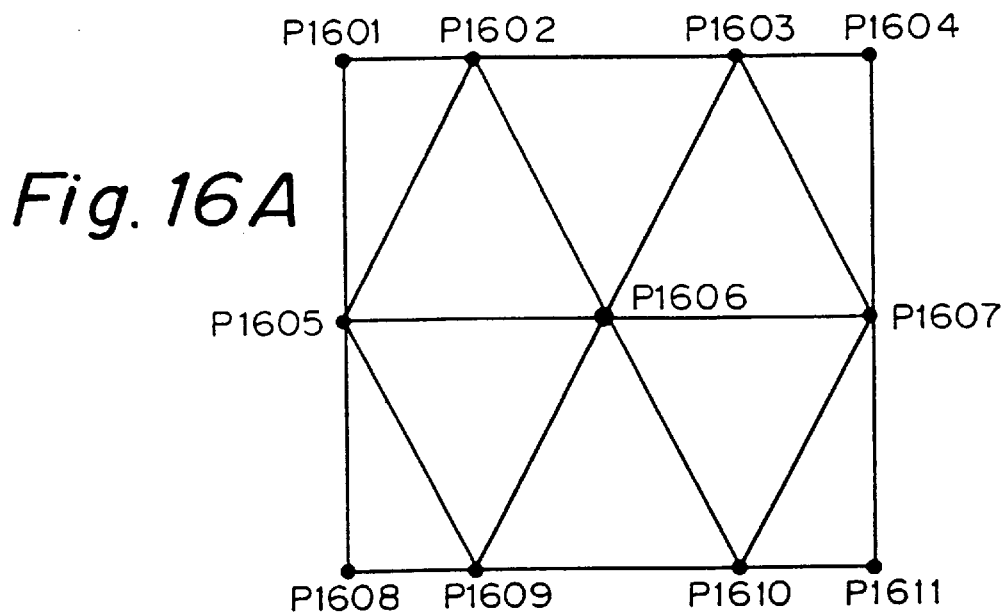
Figure 16B:
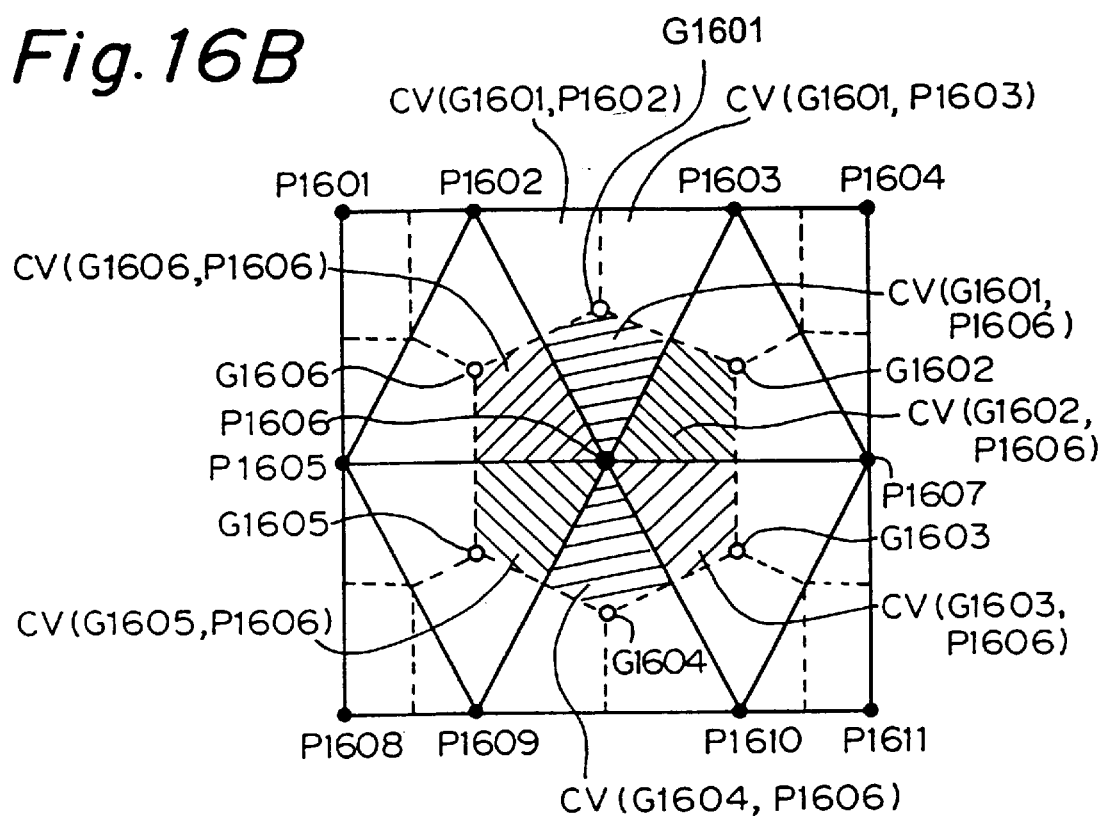

First, at step 201, assume that an original mesh configuration as illustrated in FIG. 16A is established. The original mesh configuration is formed by grids P1601 through P1611. In this case, as illustrated in FIG. 16B, circumcenters G1601, G1602, ... are defined for a triangle formed by the grids P1602, P1603 and P1606, a triangle formed by the grids P1603, P1607 and P1606, ..., respectively. Therefore, three control volumes such as CV(G1601, P1602), CV(G1601, P1603) and CV(G1601, P1606) are defined within one triangle defined by three grids such as P1602, P1603 and P1606. Also, note that control volumes CV(G1602, P1606), CV(G1603, P1606), CV(G1604, P1606), CV(G1605, P1606) and CV(G1606, P1606) in addition to the control volume CV(G1601, P1606) belong to the grid P1606. Further, at step 201, initial impurity concentrations are set for the control volumes, and a time period is initialized at a time step $\Delta t$.

Figure 16C:
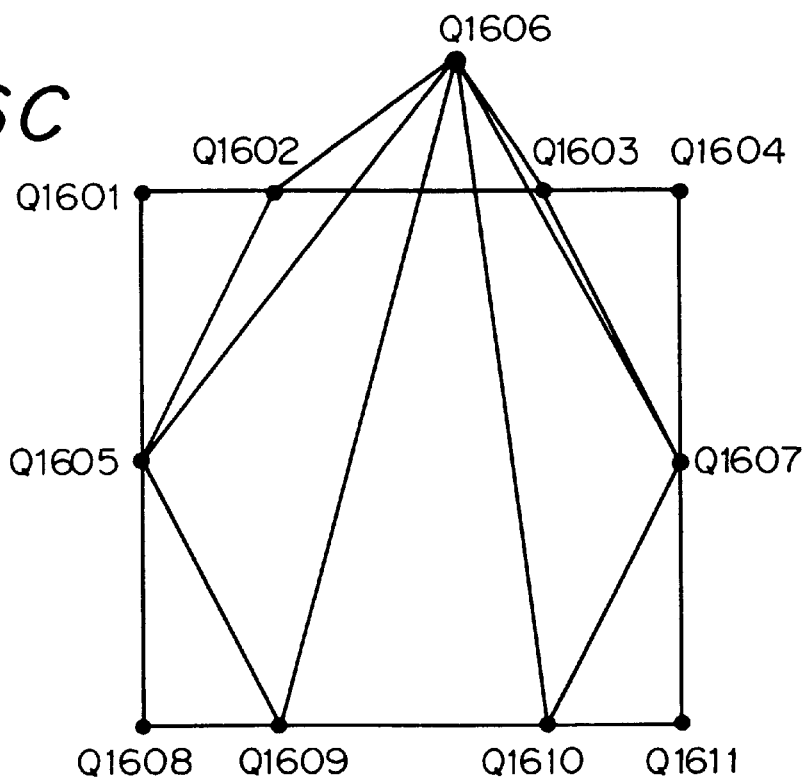

Next, at step 202, the original mesh configuration as illustrated in FIG. 16A is deformed into a mesh configuration formed by grids Q1601, Q1602, ..., and Q1611 as illustrated in FIG. 16C. In this case, the grids Q1601 through Q1611 except for the grid Q1606 are the same as the grids P1601 through P1611 except for the grid P1606, and the grid Q1606 is beyond the line defined by the grids Q1602 and Q1603 (P1102 and P1103). In other words, a triangle formed by the grids P1602, P1603 and P1606 of FIG. 16A is inverted into a triangle formed by the grids Q1602, Q1603 and Q1606 of FIG. 16C.

Note that the deformation of the grids can be calculated by solving a diffusion equation of oxygen within a silicon oxide layer and a reaction equation of oxygen and silicon at a $SiO_2/Si$ interface, for example.

Figure 16D:
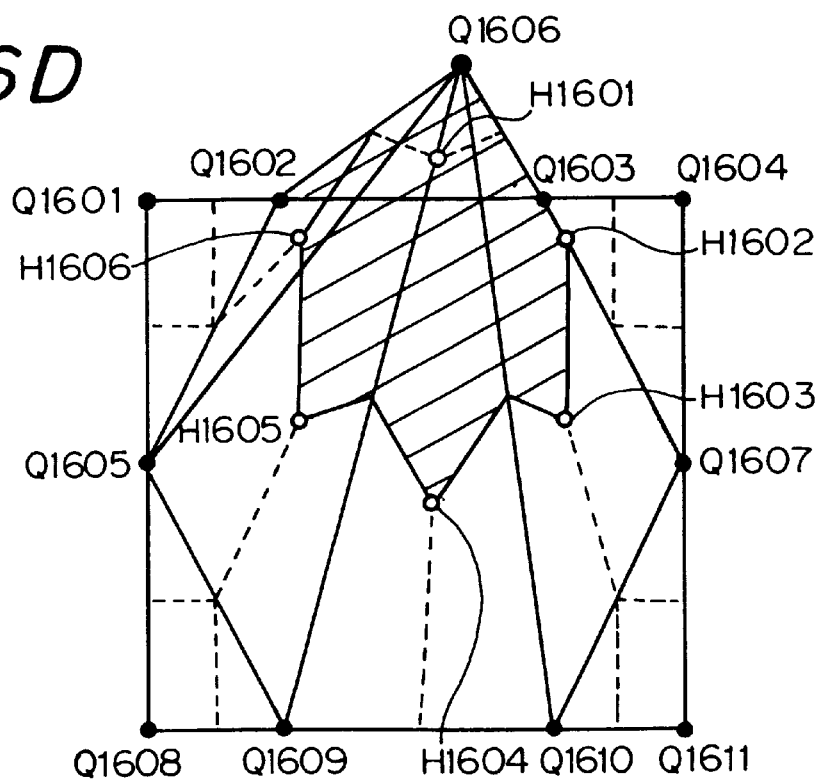

As a result, as illustrated in FIG. 16D, the control volumes related to the grid P1606 is changed to control volumes having circumcenters H1601, H1602, ..., H1606.

Next, at step 1401, it is determined whether or not the deformation at step 202 is beyond a limit value, for example, the amount of overlapping control volumes is larger than a predetermined value. As a result, only if the deformation at step 202 is beyond the limit value, does the control proceed to step 1402 which retards the time period and carries out the operation at step 202 again.

Next, at step 203, the impurity concentrations of the control volumes are renewed. For example, for the control volume CV(H1605, Q1606), $$C_{old}=(CV(G1605, P1606) / CV(H1605, Q1606))\ C_{org}$$

where $C_{org}$ is the impurity concentration of the control volume CV(G1605, P1606), and $C_{old}$ is the impurity concentration of the control volume CV(H1605, Q1606).

Figure 16E:
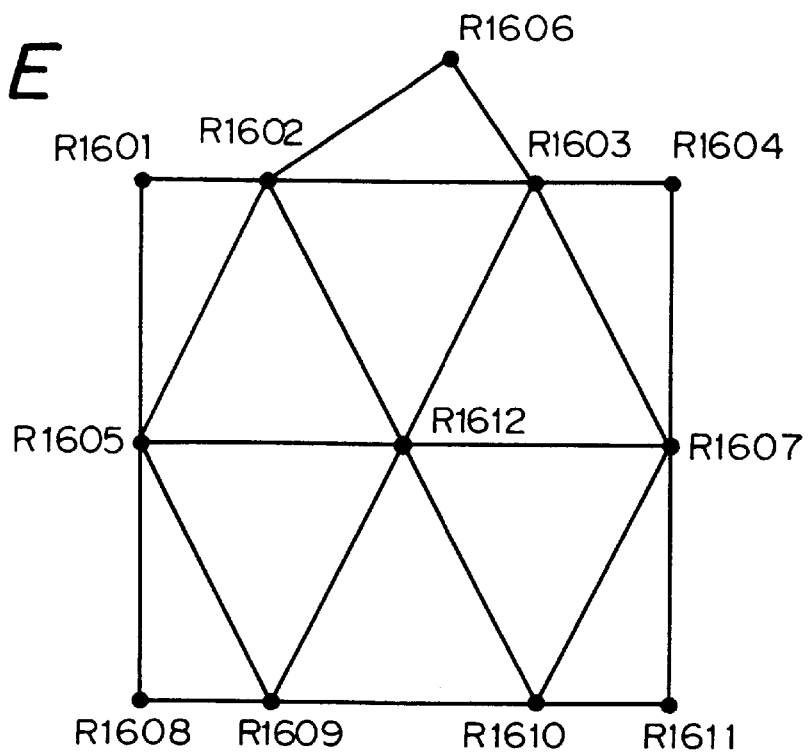
Figure 16F:
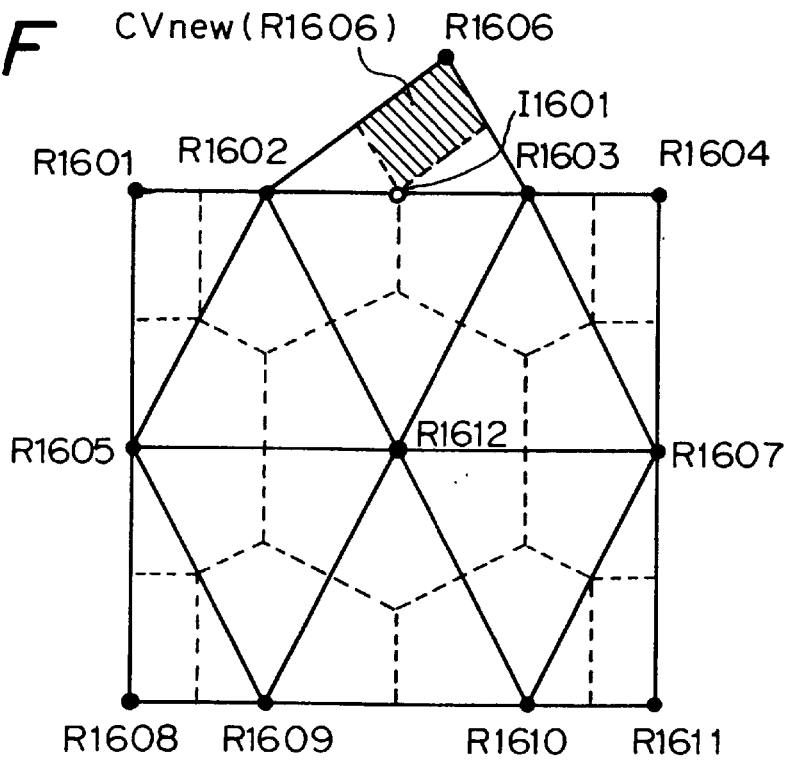
Figure 16H:
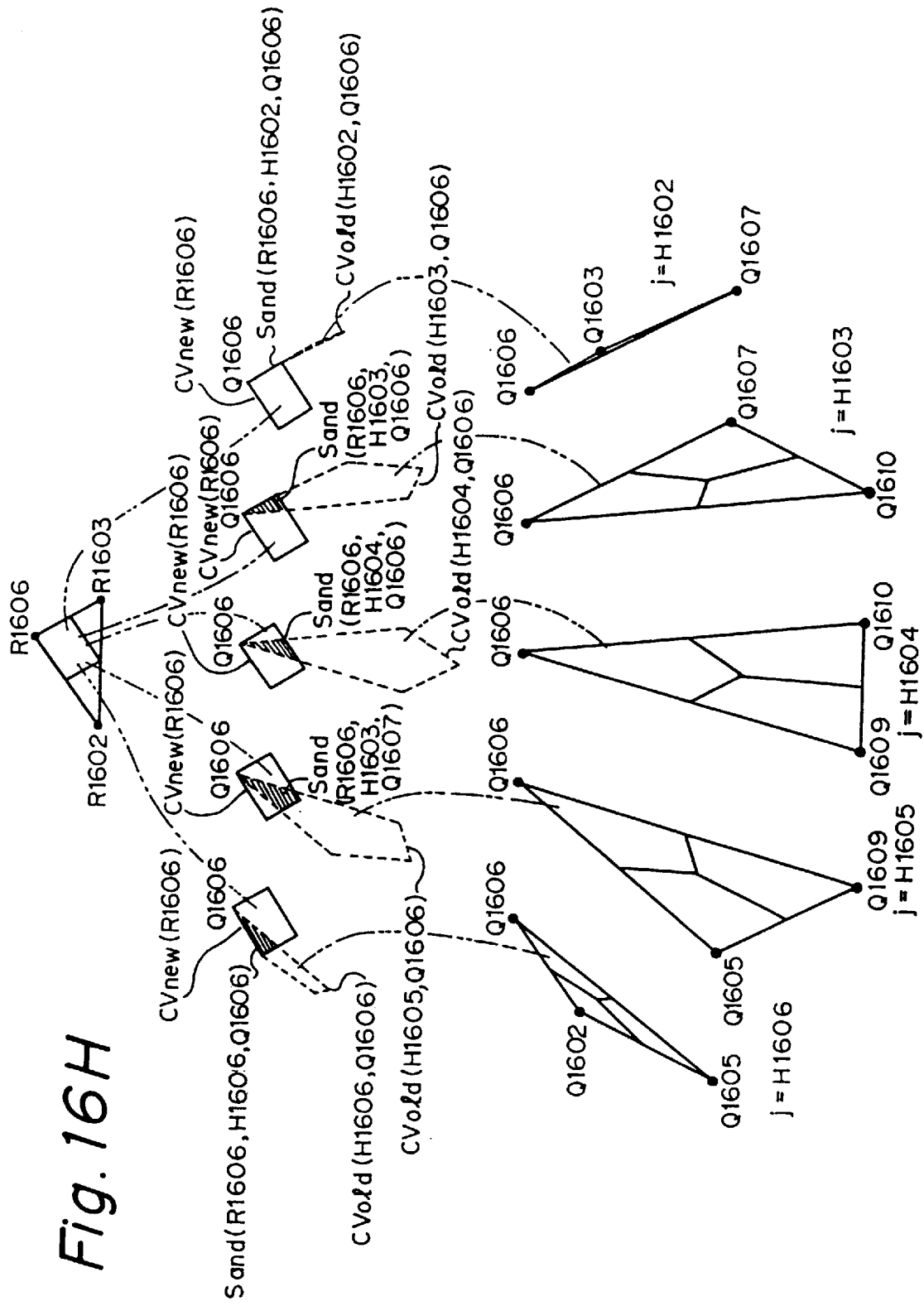

Next, the control proceeds via step 204 to step 205 which rearranges the mesh configuration as illustrated in FIG. 16C into a mesh configuration formed by grids R1601, R1602, ..., and R1612 as illustrated in FIG. 16E. In this case, the grids R1601 through R1611 are the same as the grids Q1601 through Q1611, respectively, and the grid R1612 is added. In this case, as illustrated in FIG. 16F, a control volume $CV_{new}(R1606)$ is set for the grid R1606 defined by a circumcenter I1601 and other circumcenters (not shown). In this case, the control volume $CV_{new}$ is defined only within a triangle formed by the grids R1602, R1603 and R1606, since impurities are not present outside of the semiconductor device.

Next, the control proceeds to step 1403 which will be explained next with reference to FIG. 15.

For example, in order to calculate an impurity concentration of the control volume $CV_{new}(R1606)$ of FIG. 16F, at step 1501, an impurity amount $D_{new}(R1606)$ of the control volume $CV_{new}(R1606)$ is cleared, i.e., $$D_{new}(R1606) \leftarrow 0.$$

Next, at step 1502, a region $S_{new}(R1606)$ of the control volume $CV_{new}(R1606)$ is cleared, i.e., $$S_{new}(R1606) \leftarrow 0.$$

Next, at step 1503, a product region $S_{and}(R1606, j, k)$ is calculated by $$S_{and}(R1606, j, k) \leftarrow CV_{new}(R1606) \cap CV_{old}(j,k)$$

where $CV_{old}(j, k)$ is defined for a triangle j on the side of a grid k.

Only the control volumes CVold(H1601, Q1606), CVold (H1601, Q1602), CVold(R1601, Q1603), CVold(H1602, Q1606), CVold(H1603, Q1606), CVold(H1604, Q1606), CVold(H1605, Q1606) and CVold(H1606, Q1606) are superposed onto the control volume $CV_{new}$(R1606).

The product regions $S_{and}$(R1606, H1601, Q1606), $S_{and}$(R1606, H1601, Q1602) and $S_{and}$(R1606, H1601, Q1603) are indicated by shaded portions in FIG. 16G. Also, the product regions $S_{and}$(R1606, H1602, Q1606), $S_{and}$(R1606, H1603, Q1606), $S_{and}$(R1606, H1604, Q1606), $S_{and}$(R1606, H1605, Q1606) and $S_{and}$(R1606, H1606, Q1606), are indicated by shaded portions in FIG. 16H.

Next, at step 1504, the region $S_{new}$(R1606) is renewed by
$S_{new}$(R1606)←$S_{new}$(R1606)+$S_{and}$(R1606, j, k).

Next, at step 1505, an impurity amount $D_{and}$(R1616, j, k) included in the product region $S_{and}$(R1606, j, k) is calculated by $$D_{and}(R1606, j, k) \leftarrow C_{old}(j, k) \cdot S_{and}(R1606, j, k)$$

where $C_{old}(j, k)$ is an impurity concentration of the control volume $CV_{old}(j, k)$ of FIG. 16D.

Next, at step 1506, the impurity amount $D_{new}$(R1606) is renewed by
$D_{new}$(R1606)←$D_{new}$(R1606)+$D_{and}$(R1606, j, k).

Steps 1507, 1508, 1509 and 1510 repeat the control at steps 1503 through 1506 over all the control volumes of FIG. 16D. That is, $$S_{new}(R1606) = S_{and}(R1606, H1601, Q1606) +$$
$$S_{and}(R1606, H1601, Q1602) +$$
$$S_{and}(R1606, H1601, Q1603) +$$
$$S_{and}(R1606, H1602, Q1606) +$$
$$S_{and}(R1606, H1603, Q1606) +$$
$$S_{and}(R1606, H1604, Q1606) +$$
$$S_{and}(R1606, H1605, Q1606) +$$
$$S_{and}(R1606, H1606, Q1606)$$

Also, generally $$D_{new}(i) = \sum_j \sum_k C_{old}(j,k) \cdot S_{and}(i,j,k) \qquad (5)$$

Concretely, $$D_{new}(R1606) = C_{old}(H1601, Q1606) \times S_{and}(R1606, H1601, Q1606) +$$
$$C_{old}(H1601, Q1602) \times S_{and}(R1606, H1601, Q1602) +$$
$$C_{old}(H1601, Q1603) \times S_{and}(R1606, H1601, Q1603) +$$
$$C_{old}(H1602, Q1606) \times S_{and}(R1606, H1602, Q1606) +$$
$$C_{old}(H1603, Q1606) \times S_{and}(R1606, H1603, Q1606) +$$
$$C_{old}(H1604, Q1606) \times S_{and}(R1606, H1604, Q1606) +$$
$$C_{old}(H1605, Q1606) \times S_{and}(R1606, H1605, Q1606) +$$
$$C_{old}(H1605, Q1606) \times S_{and}(R1606, H1606, Q1606)$$

Next, at step 1511, an impurity concentration $C_{new}$ of the control volume $CV_{new}$ at the grid R1606 is calculated by
$C_{new}$(R1606)←$D_{new}$(R1606) / $S_{new}$(R1606)

Steps 1512 and 1513 repeat the control at steps 1501 through 1511 over all the grids of FIGS. 16E and 16F. That is, generally, $$C_{new}(i) = D_{new}(i) / S_{new}(i)$$

Then, at step 1514, the routine of FIG. 15 is returned to step 206 of FIG. 14.

Thus, in the embodiment of the present invention applied to the triangular mesh configuration as illustrated in FIGS. 16A through 16H, since the entire control volume $CV_{new}$(R1606) of FIG. 16F can be defined by the control volumes $CV_{old}$ of FIG. 16D, the value $D_{new}$(R1606) is increased and the value $S_{new}$(R1606) is increased. As a result, the impurity concentration $C_{new}$(R1606) of the control volume $CV_{new}$(R1606) is not reduced and is close to a practical value.

The flowcharts of FIGS. 14 and 15 will be explained next with reference to FIGS. 17A through 17H, where an inverted mesh (triangle) occurs with in the region of a non-deformed semiconductor device.

Figure 17A:
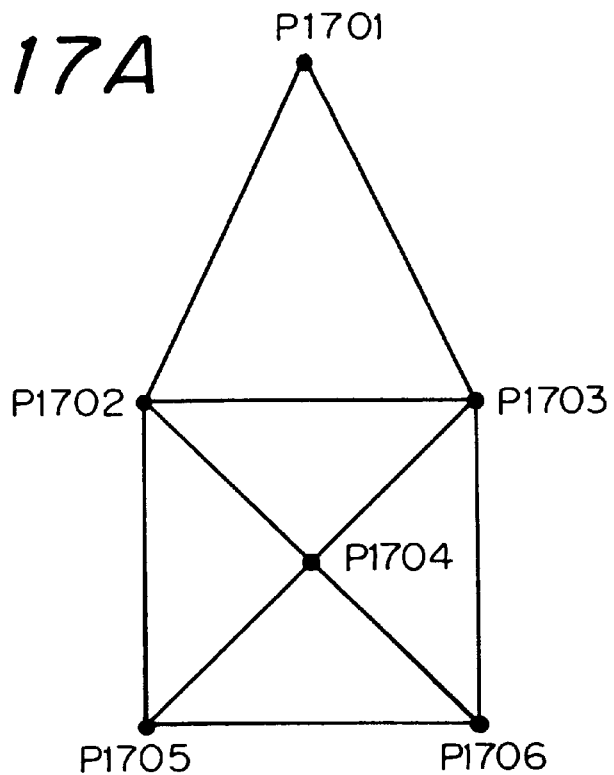
FIGS. 17A through 17I are other diagrams for explaining the flowcharts of FIGS. 14 and 15.
Figure 17B:
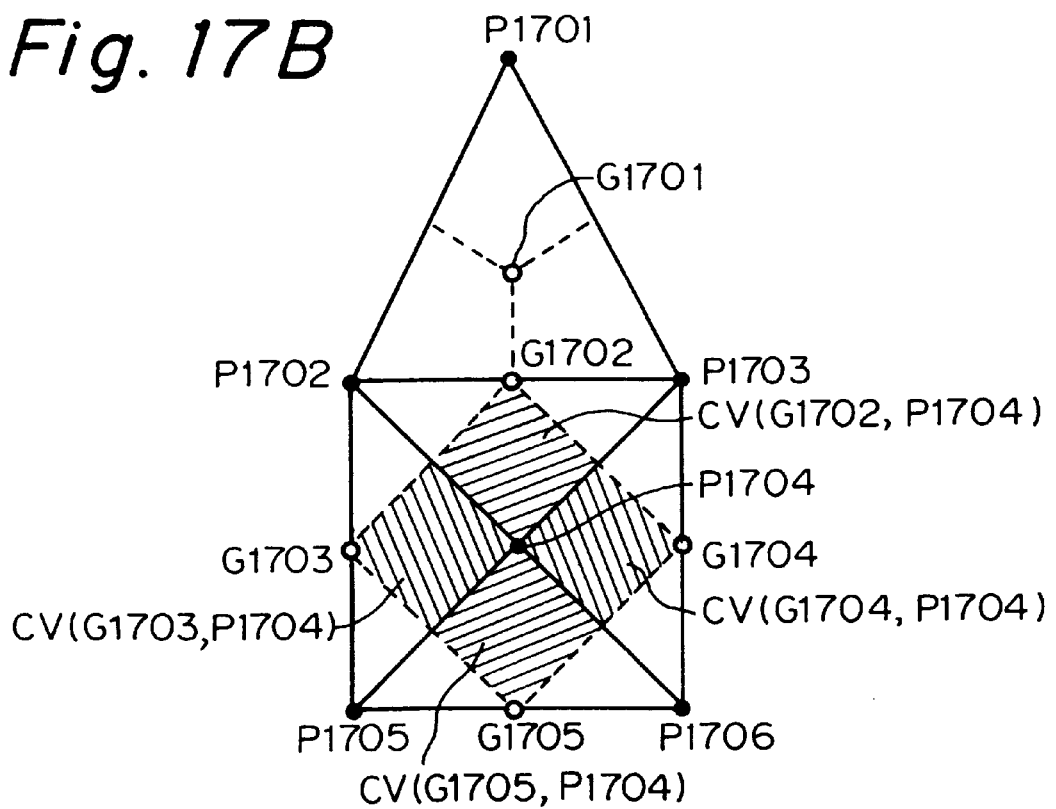

First, at step 201, assume that an original mesh configuration as illustrated in FIG. 17A is established. The original mesh configuration is formed by grids P1701 through P1706. In this case, as illustrated in FIG. 17B, circumcenters G1701, G1702, . . . are defined for a triangle formed by the grids P1701, P1702 and P1703, and a triangle formed by the grids P1702, P1703 and P1704, . . . , respectively. Also, control volumes CV(G1702, P1704), CV(G1703, P1704), CV(G1704, P1704) and CV(G1705, P1704) belong to the grid P1704. Further, at step 201, initial impurity concentrations are set for the control volumes, and a time period is initialized at a time step Δt.

Figure 17C:
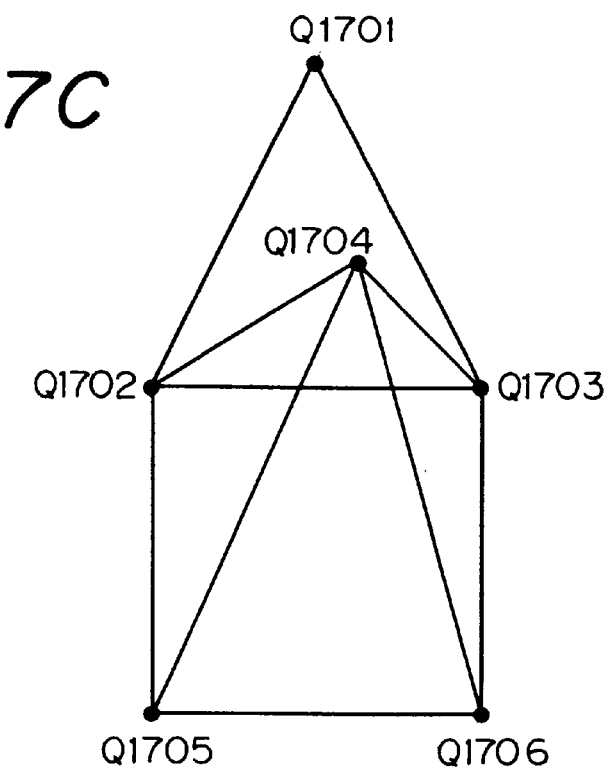

Next, at step 202, the original mesh configuration as illustrated in FIG. 17A is deformed into a mesh configuration formed by grids Q1701, Q1702, . . . , and Q1706 as illustrated in FIG. 17C. In this case, the grids Q1701 through Q1706 except for the grid Q1704 are the same as the grids P1701 through P1706 except for the grid P1704, and the grid Q1704 is beyond the line defined by the grids Q1702 and Q1703 (P1702 and P1703), but within a triangle defined by the grids Q1701, Q1702 and Q1703 (P1701, P1702 and P1703). In other words, a triangle formed by the grids P1701, P1702 and P1703 of FIG. 17A is inverted into a triangle formed by the grids Q1701, Q1702 and Q1703 of FIG. 17C within the region of the non-deformed semiconductor device.

Even in this case, the deformation of the grids can be calculated by solving a diffusion equation of oxygen within a silicon oxide layer and a reaction equation of oxygen and silicon at a $SiO_2$/Si interface, for example.

Figure 17D:
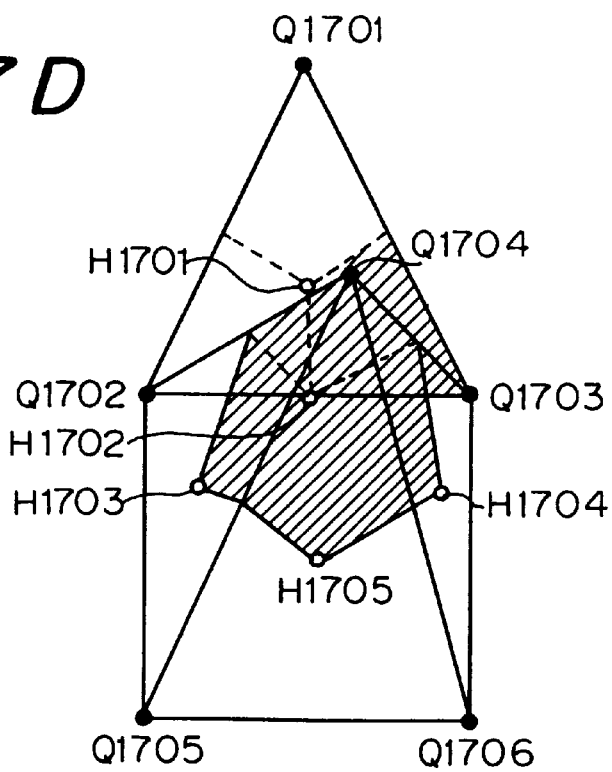

As a result, as illustrated in FIG. 17D, the control volumes related to the grid P1704 are changed to control volumes having circumcenters H1701, H1702, . . . , H1705.

Next, at step 1401, it is determined whether or not the deformation at step 202 is beyond a limit value, for example, the amount of overlapping control volumes is larger than a predetermined value. As a result, only if the deformation at step 202 is beyond the limit value, does the control proceed to step 1402 which retards the time period and carries out the operation at step 202 again.

Next, at step 203, the impurity concentrations of the control volumes are renewed. For example, for the control volume CV(H1704, Q1704), $$C_{old} = (CV(G1704, P1704) / CV(H1704, Q1704)) C_{org}$$

where $C_{org}$ is the impurity concentration of the control volume CV(G1704, P1704), and $C_{old}$ is the impurity concentration of the control volume CV(H1704, Q1704).

Figure 17E:
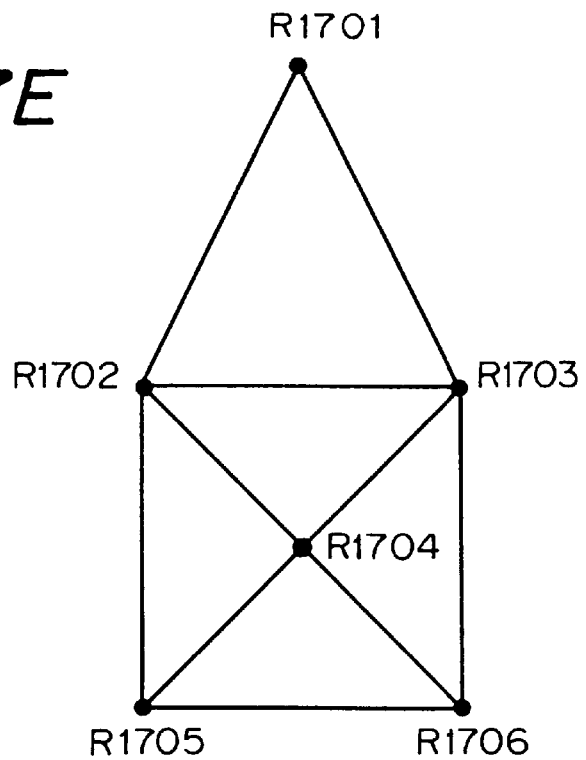

Next, the control proceeds via step 204 to step 205 which rearranges the mesh configuration as illustrated in FIG. 17C into a mesh configuration formed by grids R1701, R1702, . . . , and R1706 as illustrated in FIG. 17E. In this case, the grids R1701 through R1706 are the same as the grids Q1701 through Q1706, respectively. In this case, as illustrated in FIG. 17F, a control volume $CV_{new}$ (R1703) set for the grid R1703 are formed by a control volume CV(I1701, R1703), a control volume CV(I1702, R1703) arnd a control volume CV(I1704, R1703).

Next, the control proceeds to step 1403 which will be explained next with reference to FIG. 15.

Figure 17F:
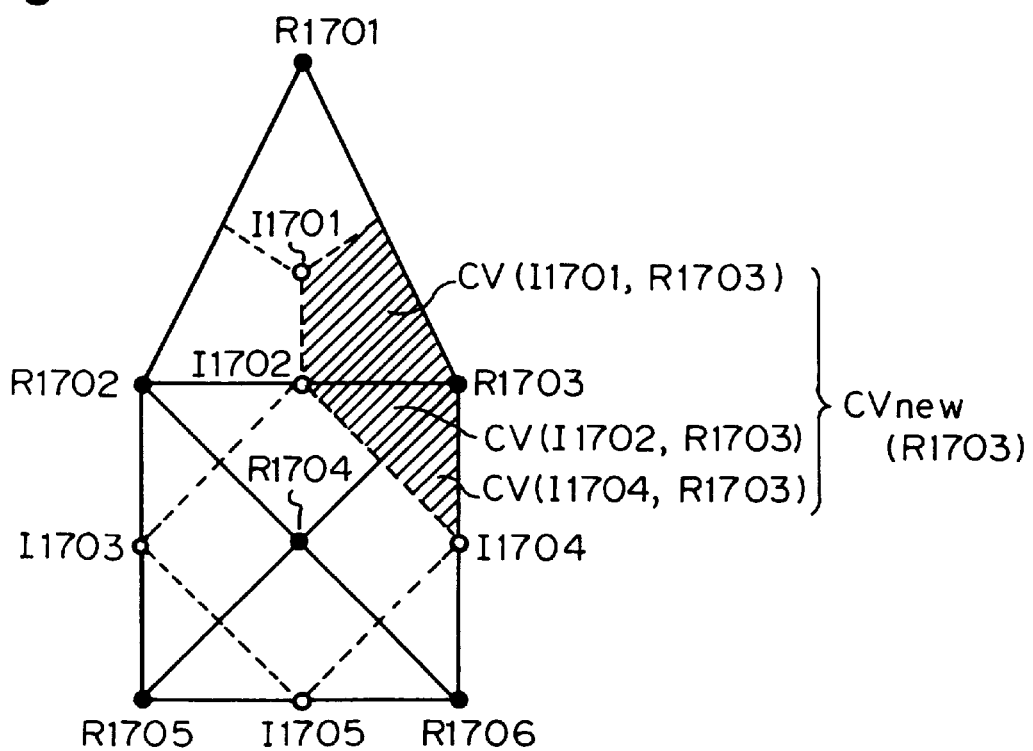

For example, in order to calculate an impurity concentration of the control volume $CV_{new}$(R1703) of FIG. 17F, at step 1501, an impurity amount $D_{new}$(R1703) of the control volume $CV_{new}$(R1703) is cleared, i.e., $D_{new}$(R1703)←O.

Next, at step 1502, a region $S_{new}$(R1703) of the control volume $CV_{new}$(R1703) is cleared, i.e., $S_{new}$(R1703)←O.

Next, at step 1503, a product region $S_{and}$(R1703, j, k) is calculated by $$S_{and}(R1703, j, k) \leftarrow CV_{new}(R1703) \cap CV_{old}(j, k)$$

where $CV_{old}$(j, k) is defined for a triangle j on the side of a grid k.

Only the control volumes $CV_{old}$(H1701, Q1703), $CV_{old}$(H1702, Q170), $CV_{old}$(H1702, Q1704), $CV_{old}$(H1703, Q1704), $CV_{old}$(H1704, Q1703), $CV_{old}$(H1704, Q1704), and $CV_{old}$(H1705, Q1704) are superposed onto the control volume $CV_{new}$(R1703).

Figure 17G:
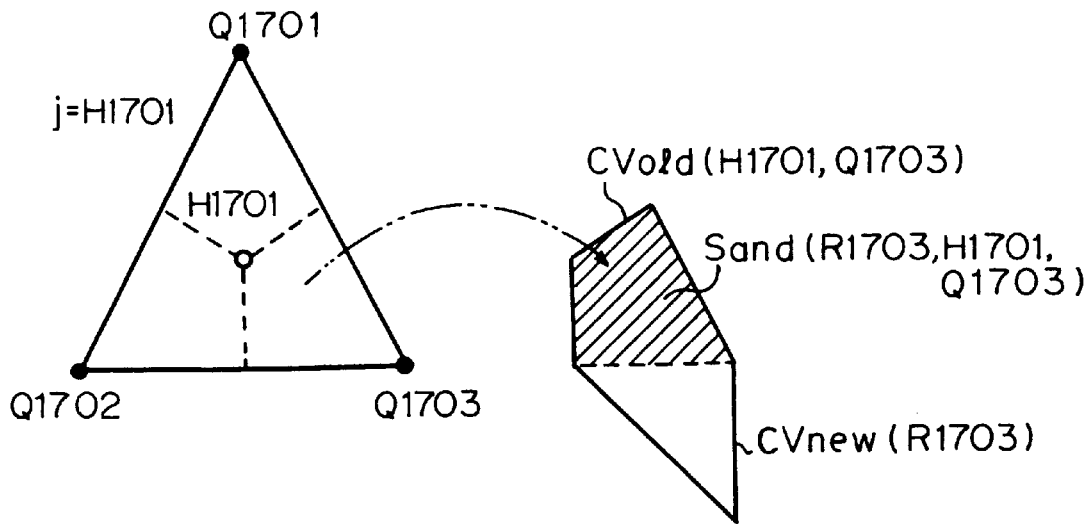
Figure 17H:
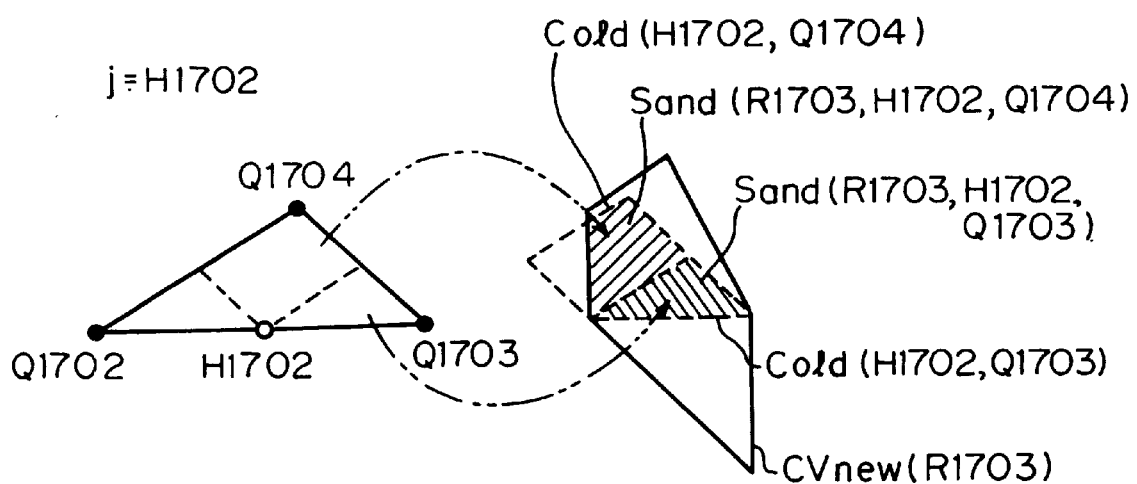

The product region $S_{and}$(R1703, H1701, Q1703) is indicated by a shaded portion in FIG. 17G. Also, the product regions $S_{and}$(R1703, H1702, Q1703) and $S_{and}$(R1703, H1702, Q1704), are indicated by a shaded portion in FIG. 17H.

Figure 17I:
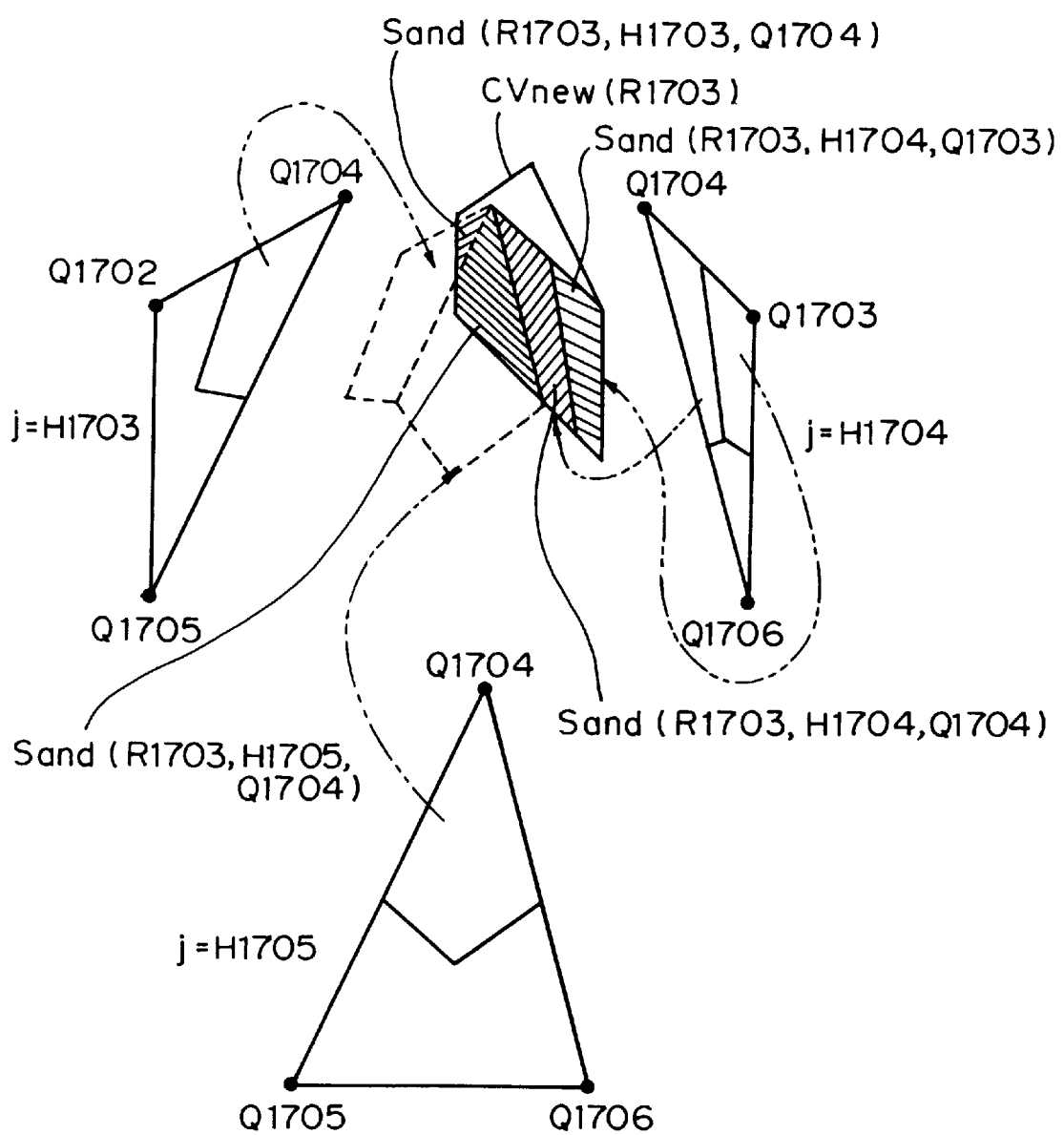

The product regions $S_{and}$(R1703, H1703, Q1704), $S_{and}$(R1703, H1704, Q1703), $S_{and}$(R1703, H1704, Q1704) and $S_{and}$(R1703, H1705, Q1704) are indicated by shaded portions in FIG. 17I.

Next, at step 1504, the region $S_{new}$(R1703) is renewed by $S_{new}$(R1703)←$S_{new}$(R1703)+$S_{and}$(R1703, j, k).

Next, at step 1505, an impurity amount $D_{and}$(R1703, j, k) included in the product region $S_{and}$(R1703, j, k) is calculated by $D_{and}$(R1703, j, k)←$C_{old}$(j, k)·$S_{and}$(R1703, j, k)

where $C_{old}$(j, k) is an impurity concentraiton of the control volume $CV_{old}$(j, k) of FIG. 17D.

Next, at step 1506, the impurity amount $D_{new}$(R1703) is renewed by $D_{new}$(R1703)←$D_{new}$(R1703)+$D_{and}$(R1703, j, k).

Steps 1507, 1508, 1509 and 1510 repeat the control at steps 1503 through 1506 over all the control volumes of FIG. 17D. That is, $S_{new}$(R1703)
=$S_{and}$(R1703, H1701, Q1703)
+$S_{and}$(R1703, H1702, Q1703)
+$S_{and}$(R1703, H1702, Q1704)
+$S_{and}$(R1703, H1703, Q1703)
+$S_{and}$(R1703, H1704, Q1703)
+$S_{and}$(R1703, H1704, Q1704)
+$S_{and}$(R1703, H1705, Q1704)
Also,
$D_{new}$(R1703)
=$C_{old}$(H1701, Q1703) × $S_{and}$(R1703, H1701, Q1703)
+$C_{old}$(H1702, Q1703) × $S_{and}$(R1703, H1702, Q1703)

-continued

+$C_{old}$(H1702, Q1704) × $S_{and}$(R1703, H1702, Q1704)
+$C_{old}$(H1703, Q1703) × $S_{and}$(R1703, H1703, Q1703)
+$C_{old}$(H1704, Q1703) × $S_{and}$(R1703, H1704, Q1703)
+$C_{old}$(H1704, Q1704) × $S_{and}$(R1703, H1704, Q1704)
+$C_{old}$(H1705, Q1704) × $S_{and}$(R1703, H1705, Q1704)

Next, at step 1511, an impurity concentration $C_{new}$ of the control volume $CV_{new}$ at the grid R1703 is calculated by $C_{new}$(R1703)←$D_{new}$(R1703) / $S_{new}$(R1703)

Steps 1512 and 1513 repeat the control at steps 1501 through 1511 over all the grids of FIGS. 17E and 17F.

Then, at step 1514, the routine of FIG. 15 is returned to step 206 of FIG. 14.

Thus, in the embodiment of the present invention applied to the triangular mesh configuration as illustrated in FIGS. 17A through 17H, although the grid P1704 (Q1704, R1704) is moved, the shape of the control volume $CV_{new}$(R1703) is the same as of the control volume $CV_{org}$(P1703) of FIG. 17A. As a result, the impurity concentration $C_{new}$(R1703) is close to a practical value.

The flowcharts of FIGS. 14 and 15 will be explained next with reference to FIGS. 18A through 18J, where overlapping of control volumes occurs.

Figure 18A:
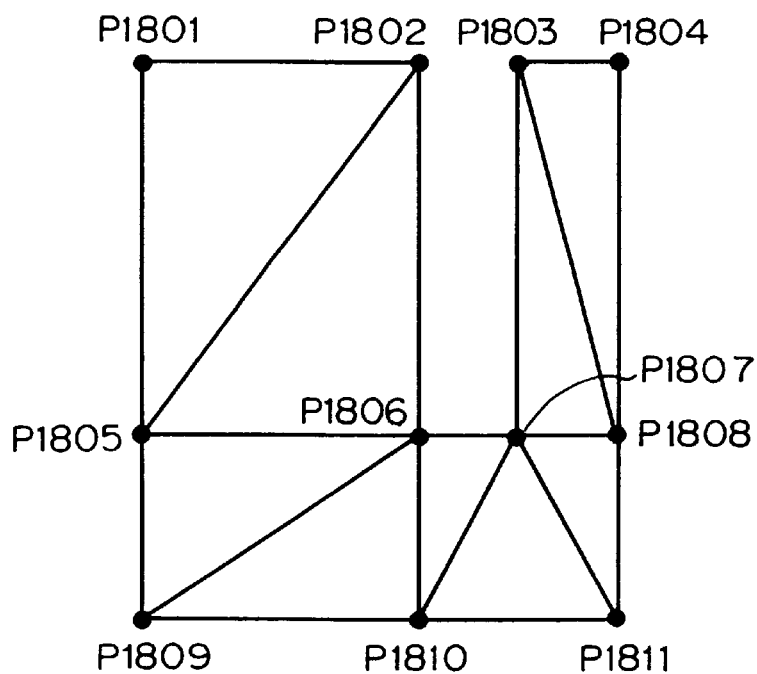
FIGS. 18A through 18J are still other diagrams for explaining the flowcharts of FIGS. 14 and 15.
Figure 18B:
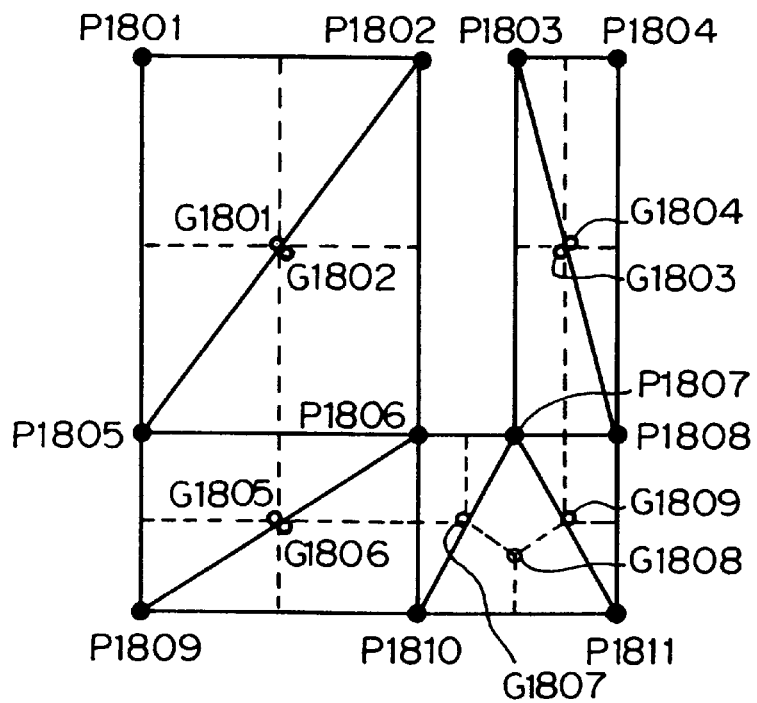

First, at step 201, assume that an original mesh configuration as illustrated in FIG. 18A is established. The original mesh configuration is formed by grids P1801 through P1811. In this case, a trench is defined by the grids P1802, P1806, P1807 and P1803. Also, as illustrated in FIG. 18B, circumcenters G1801, G1802, . . . are defined for a triangle formed by the grids P1801, P1802 and P1805, a triangle formed by the grids P1802, P1805 and P1806, . . . .

Further, at step 201, initial impurity concentrations are set for control volumes, and a time period is initialized at a time step Δt.

Figure 18C:
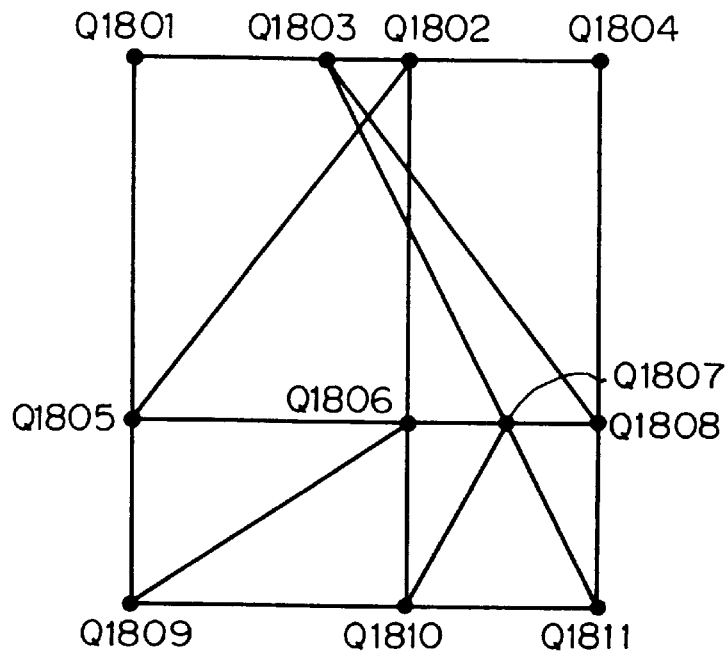

Next, at step 202, the original mesh configuration as illustrated in FIG. 18A is deformed into a mesh configuration formed by grids Q1801, Q1802, . . . , and Q1811 as illustrated in FIG. 18C. In this case, the grids Q1801 through Q1811 except for the grid Q1803 are the same as the grids P1801 through P1811 except for the grid P1803, and the grid Q1803 is beyond the trench, so that overlapping of control volumes occurs as indicated by a shaded portion in FIG. 18D.

Even in this case, the deformation of the grids can be calculated by solving a diffusion equation of oxygen within a silicon oxide layer and a reaction equation of oxygen and silicon at a $SiO_2$/Si interface, for example.

Figure 18D:
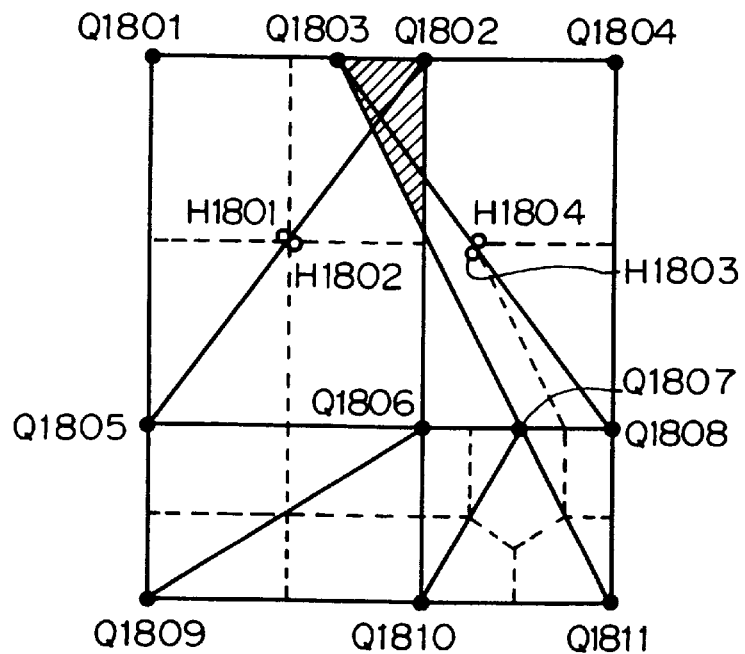

As a result, as illustrated in FIG. 18D, the control volumes related to the grid P1803 are changed to control volumes having circumcenters H1801, H1802, H1803, and H1804.

Next, at step 1401, it is determined whether or not the deformation at step 202 is beyond a limit value, for example, the amount of overlapping control volumes is larger than a predetermined value. As a result, only if the deformation at step 202 is beyond the limit value, does the control proceed to step 1402 which retards the time period and carries out the operation at step 202 again.

Next, at step 203, the impurity concentrations of the control volumes are renewed.

Figure 18E:
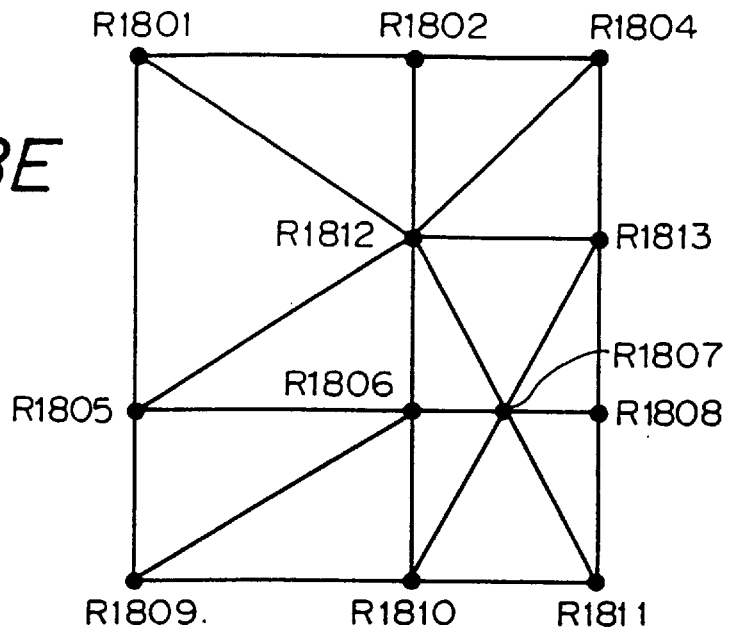

Next, the control proceeds via step 204 to step 205 which rearranges the mesh configuration as illustrated in FIG. 18C into a mesh configuration formed by grids R1801, R1802, and R1804 through R1813 as illustrated in FIG. 18E. In this case, the grids R1801, R1802, R1804 through R1811 are the same as the grids Q1801, Q1802, Q1804 through Q1811, respectively. Also, the grid Q1803 is canceled, and the grids R1812 and R1813 are added. In this case, as illustrated in FIG. 18F, a control volume $CV_{new}(R1802)$ set for the grid R1802 are formed by a control volume CV(I1801, R1802) and a control volume CV(I1802, R1802).

Next, the control proceeds to step 1403 which will be explained next with reference to FIG. 15.

Figure 18F:
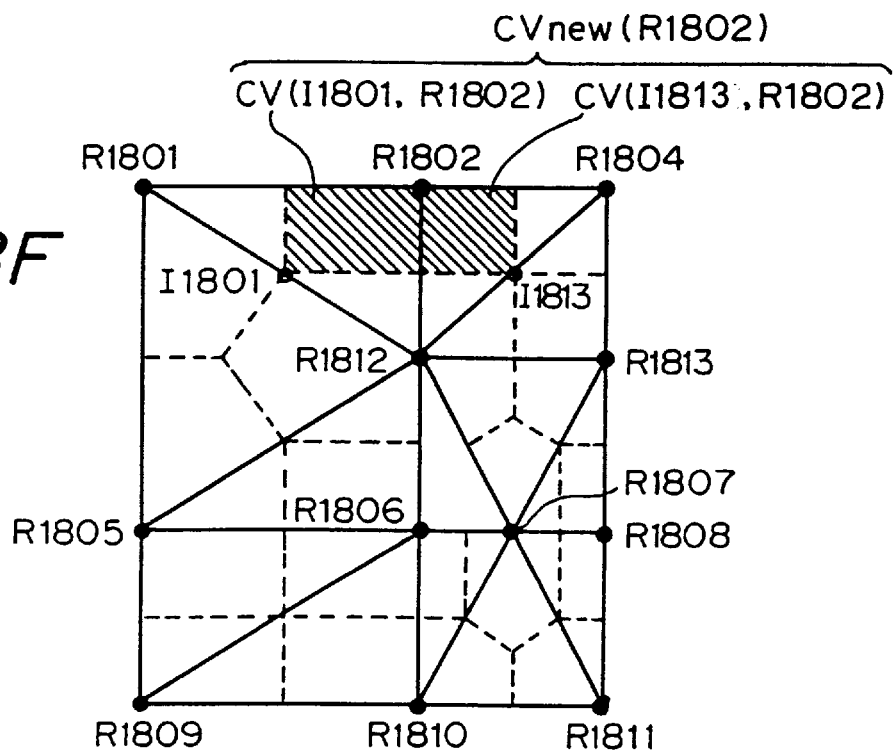

For example, in order to calculate an impurity concentration of the control volume $CV_{new}(R1802)$ of FIG. 18F, at step 1501, an impurity amount $D_{new}(R1802)$ of the control volume $CV_{new}(R1802)$ is cleared, i.e., $D_{new}(R1802) \leftarrow 0$.

Next, at step 1502, a region $S_{new}(R1802)$ of the control volume $CV_{new}(R1802)$ is cleared, i.e., $S_{new}(R1802) \leftarrow 0$.

Next, at step 1503, a product region $S_{and}(R1802, j, k)$ is calculated by $S_{and}(R1802, j, k) \leftarrow CV_{new}(R1802) \cap CV_{old}(j, k)$ where $CV_{old}(j, k)$ is defined for a triangle j on the side of a grid k.

Only the control volumes $CV_{old}(H1801, Q1802)$, $CV_{old}(H1802, Q1802)$, $CV_{old}(H1803, Q1803)$, $CV_{old}(H1804, Q1803)$ and $CV_{old}(H1804, Q1804)$ are superposed onto the control volume $CV_{new}(R1802)$.

Figure 18G:
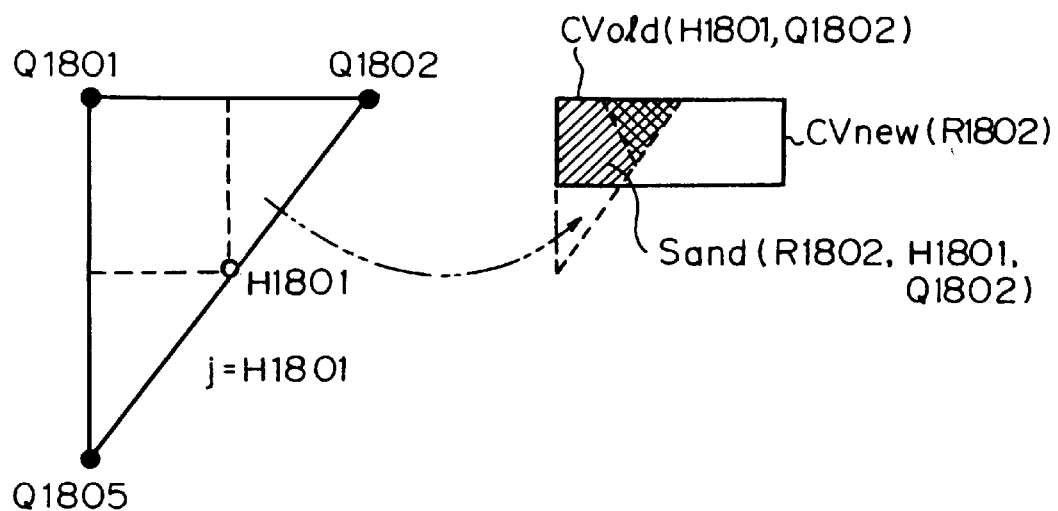
Figure 18H:
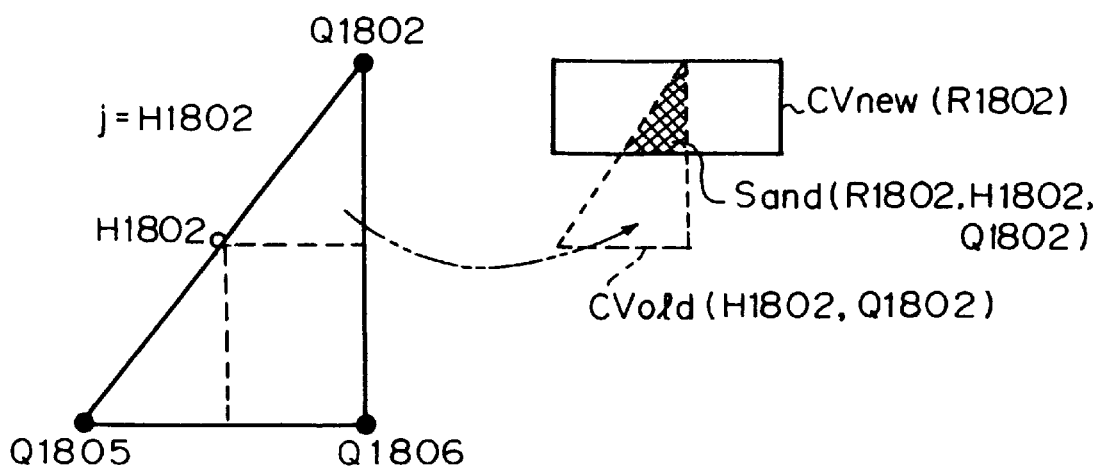
Figure 18I:
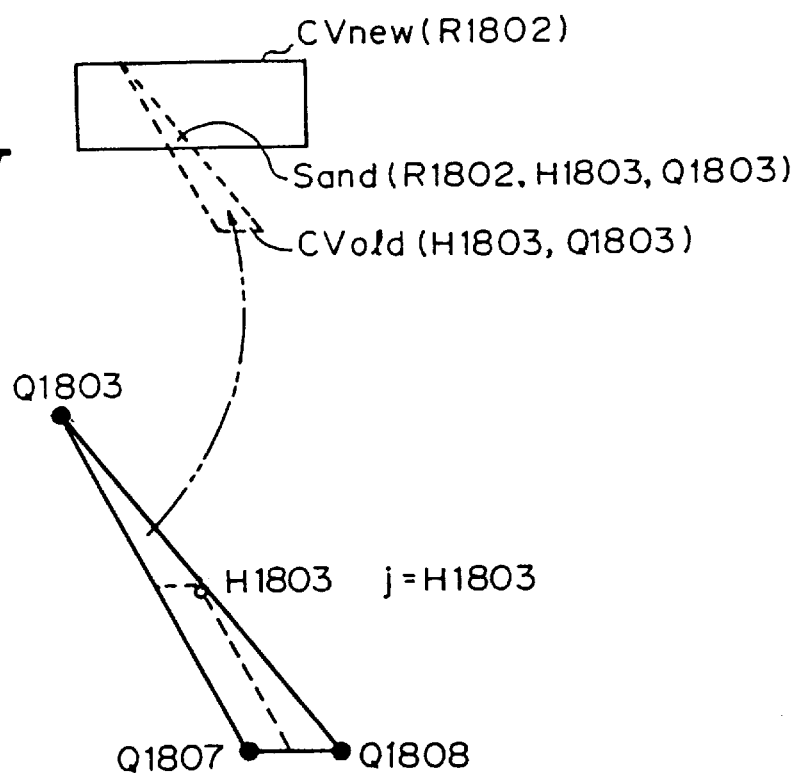
Figure 18J:
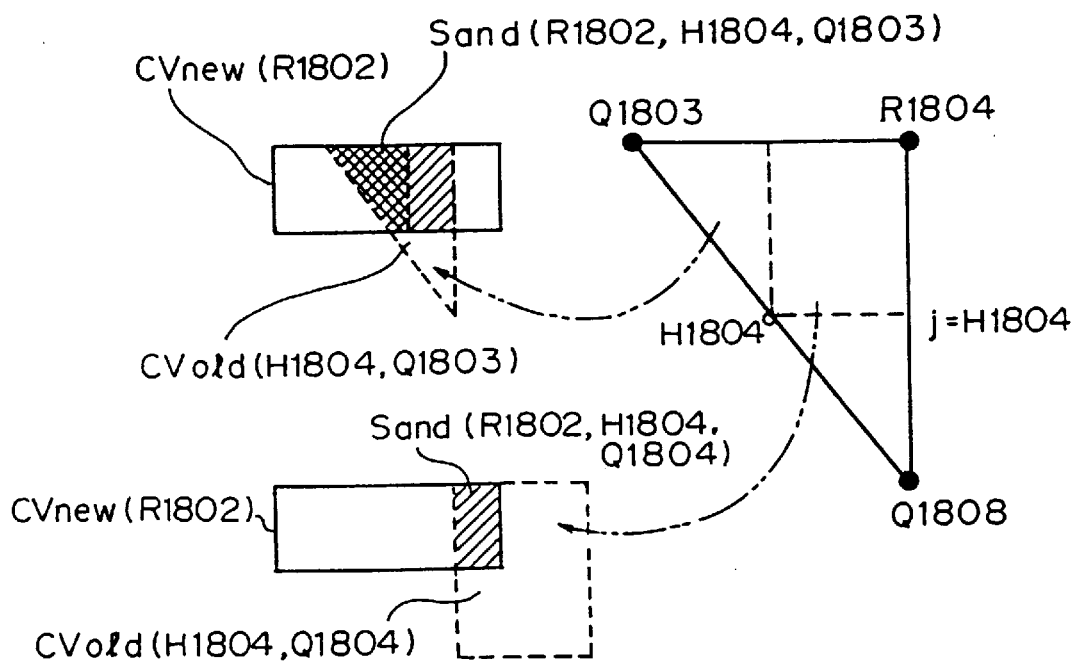

The product region $S_{and}(R1802, H1801, Q1802)$ is indicated by a shaded portion in FIG. 18G. Also, the product region $S_{and}(R1802, H1802, Q1802)$ is indicated by a shaded portion in FIG. 18H. Further, the product region $S_{and}(R1802, H1802, Q1803)$ is indicated by shaded portion in FIG. 18I. Further, the product region $S_{and}(R1802, H1804, Q1803)$ and $S_{and}(R1802, H1804, Q1804)$ are indicated by shaded portions in FIG. 18J.

Next, at step 1504, the region $S_{new}(R1802)$ is renewed by $S_{new}(R1802) \leftarrow S_{new}(R1802) + S_{and}(R1802, j, k)$.

Next, at step 1505, an impurity amount $D_{and}(R1802, j, k)$ included in the product region $S_{and}(R1802, j, k)$ is calculated by $$D_{and}(R1802, j, k) \leftarrow C_{old}(j, k) \cdot S_{and}(R1802, j, k)$$

where $C_{old}(j, k)$ is an impurity concentration of the control volume $CV_{old}(j, k)$ of FIG. 18D.

Next, at step 1506, the impurity amount $D_{new}(R1802)$ is renewed by $$D_{new}(R1802) \leftarrow D_{new}(R1802) + D_{and}(R1802, j, k).$$

Steps 1507, 1508, 1509 and 1510 repeat the control at steps 1503 through 1506 over all the control volumes of FIG. 18D. That is, $S_{new}(R1802)$
$= S_{and}(R1802, H1801, Q1802)$
$+ S_{and}(R1802, H1802, Q1802)$
$+ S_{and}(R1802, H1803, Q1803)$
$+ S_{and}(R1802, H1804, Q1803)$
$+ S_{and}(R1802, H1804, Q1804)$
Also,
$D_{new}(R1802)$
$= C_{old}(H1801, Q1802) \times S_{and}(R1802, H1801, Q1802)$
$+ C_{old}(H1802, Q1802) \times S_{and}(R1802, H1802, Q1802)$
$+ C_{old}(H1803, Q1803) \times S_{and}(R1802, H1803, Q1803)$
$+ C_{old}(H1804, Q1803) \times S_{and}(R1802, H1804, Q1803)$
$+ C_{old}(R1804, Q1804) \times S_{and}(R1802, H1804, Q1804)$ Next, at step 1511, an impurity concentration $C_{new}$ of the control volume $CV_{new}$ at the grid R1802 is calculated by $C_{new}(R1802) \leftarrow D_{new}(R1802) / S_{new}(R1802)$ Steps 1512 and 1513 repeat the control at steps 1501 through 1511 over all the grids of FIGS. 18E and 18F.

Then, at step 1514, the routine of FIG. 15 is returned to step 206 of FIG. 14.

Figure 19:
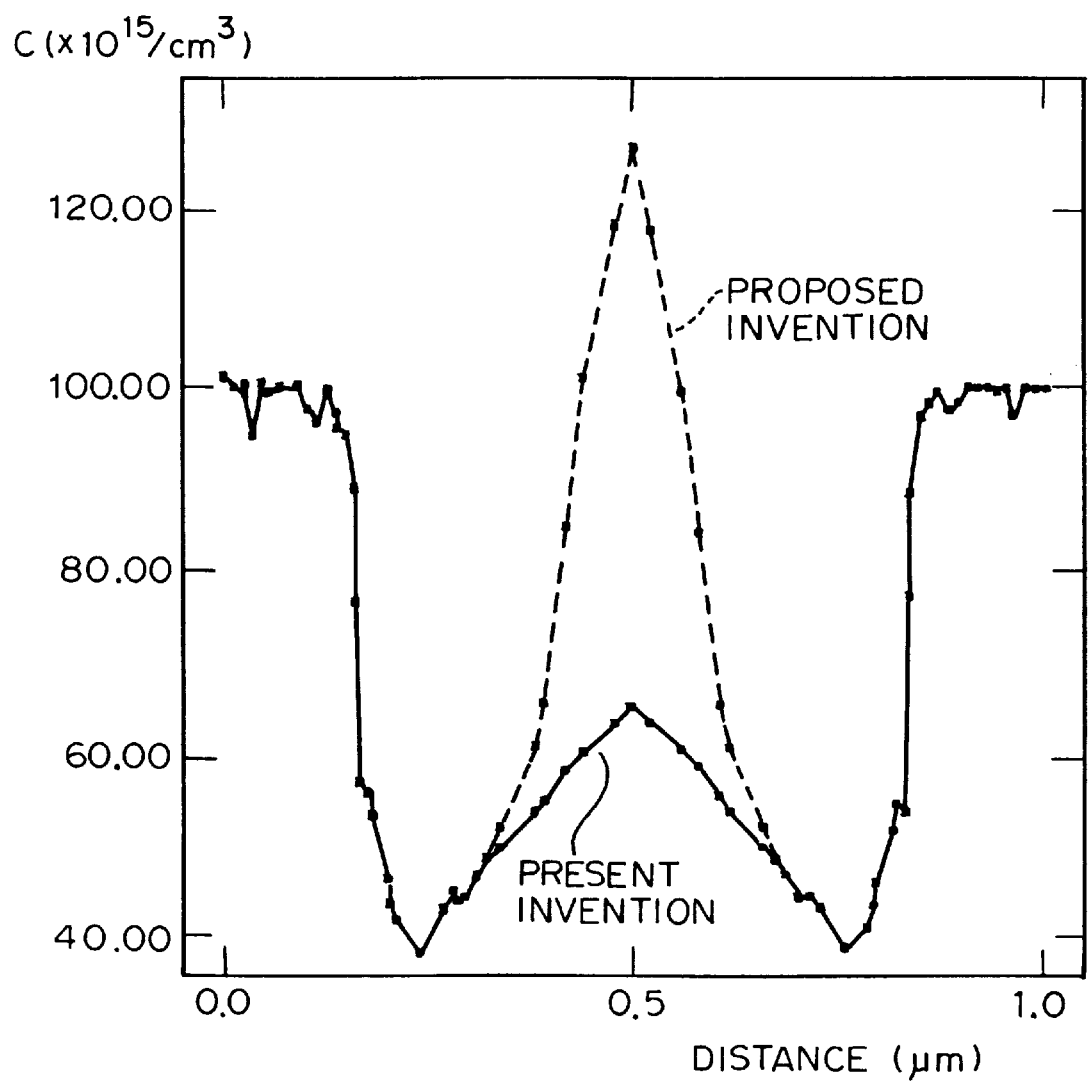
FIG. 19 is a diagram showing a simulation result obtained by the flowcharts of FIGS. 14 and 15 and the diagrams of FIGS. 18A through 18J.

Thus, in the embodiment of the present invention applied to the triangular mesh configuration as illustrated in FIGS. 18A through 18J, although overlapping of control volumes occurs so that the amount $D_{new}R1802)$ is increased, the amount $S_{new}(R1802)$ is also increased. As a result, the impurity concentration of the control volume $CV_{new}(R1802)$ is not so increased as shown in FIG. 19, and therefore, is close to a practical value. Note that, at a center portion of FIG. 19 where overlapping of control volumes occurs, since the control volumes are compressed, the impurity concentration thereof is increased in accordance with a degree of the compression.

As explained hereinabove, according to the present invention, since control volumes for grids are defined to include the grids, even if a triangular mesh configuration is deformed so that overlapping or inverting of control volumes occurs, the total amount of impurities is almost preserved between the deformed mesh configuration and the non-deformed mesh configuration.

I claim:

1. A method for simulating a concentration of impurities within a semiconductor device while said semiconductor device is being oxidized, comprising the steps of:

setting a first triangular mesh configuration in a semiconductor device, said first triangular mesh configuration having first grids arranged in first triangles, one of said first triangles being divided into three first areas each of which subtends a respective first control volume, each of said first control volumes including a circumcenter and one grid of a respective one of said first triangles;

deforming said first triangle mesh configuration to a second triangular mesh configuration after said semiconductor device is assumed to be oxidized for a time step period, said second triangular mesh configuration having second grids arranged in second triangles, one of said second triangles being divided into three second areas each of which subtends a respective second control volume, each of said second control volumes including a circumcenter and one grid of a respective one of said second triangles;

regenerating a third triangular mesh configuration in said semiconductor device after said deforming step is carried out, said third triangular mesh configuration having third grids arranged in third triangles, one of said third triangles being divided into three third areas each of which subtends a respective third control volume, each of said third control volumes including a circumcenter and one grid of a respective one of said third triangles; and calculating impurity concentrations in said third grids in accordance with product areas between said third control volumes and said second control volumes and impurity concentrations of said second control volumes.

2. A method for simulating a concentration of impurities within a semiconductor device while said semiconductor device is being oxidized, comprising the steps of:

setting a first triangular mesh configuration in a semiconductor device, said first triangular mesh configuration having first grids arranged in first triangles, one of said first triangles being divided into three first areas each of which subtends a respective first control volume, each of said first control volumes including a circumcenter and one grid of a respective one of said first triangles;

deforming said first triangular mesh configuration to a second triangular mesh configuration after said semiconductor device is assumed to be oxidized for a time step period, said second triangular mesh configuration having second grids arranged in second triangles being divided into three second areas each of which subtends a respective second control volume, each of said second control volumes including a circumcenter and one grid of a respective one of said second triangles;

changing impurity concentrations of said second control volumes in accordance with ratios of said second control volumes to respective ones of said first control volumes;

regenerating a third triangular mesh configuration in said semiconductor device after said impurity concentration changing step is carried out, said third triangular mesh configuration having third grids arranged in third triangles, one of said third triangles being divided into three third areas each of which subtends a respective third control volume, each of said third control volumes including a circumcenter and one grid of a respective one of said third triangles;

calculating impunity concentrations in said third grids by solving an impurity diffusion equation in accordance with product areas between said third control volumes and said second control volumes and impurity concentrations of said second control volumes.

3. The method as set forth in claim 2, wherein said impurity concentration calculating step comprises the steps of:

calculating a product area between one of said third control volumes and one of said second control volumes;

calculating impurities included said product area by multiplying an impurity concentration of said one of said second control volumes by said product area;

accumulating said product area to obtain a total area of said one of said third control volumes;

accumulating said impurities to obtain a total number of impurities; and dividing said total number of impurities by said total area to obtain said impurity concentrations of said third control volumes, said impurity concentrations of said third control volumes being defined for said third grids.

* * * * *